United States Patent
Kaneko

(10) Patent No.: US 7,221,693 B2
(45) Date of Patent: May 22, 2007

(54) SURFACE-EMITTING TYPE SEMICONDUCTOR LASER, OPTICAL MODULE, AND OPTICAL TRANSMISSION DEVICE

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 268 days.

(21) Appl. No.: 10/911,605

(22) Filed: Aug. 5, 2004

(65) Prior Publication Data

US 2005/0053110 A1 Mar. 10, 2005

(30) Foreign Application Priority Data

Aug. 7, 2003 (JP) .............. 2003-289049

(51) Int. Cl.
*H01S 5/00* (2006.01)

(52) U.S. Cl. .............. 372/50.21; 372/50.124; 372/50.1

(58) Field of Classification Search .............. 372/50.1, 372/50.124, 50.21
See application file for complete search history.

(56) References Cited

U.S. PATENT DOCUMENTS

| 4,607,368 | A | * | 8/1986 | Hori ..................... 372/45.01 |
| 5,383,216 | A | * | 1/1995 | Takemi .................. 372/50.1 |
| 5,475,701 | A | | 12/1995 | Hibbs-Brenner |
| 5,533,041 | A | * | 7/1996 | Matsuda et al. .......... 372/50.1 |
| 5,606,572 | A | | 2/1997 | Swirhun et al. |
| 5,633,527 | A | * | 5/1997 | Lear .................... 257/432 |
| 5,757,837 | A | * | 5/1998 | Lim et al. .............. 372/50.21 |
| 5,848,088 | A | * | 12/1998 | Mori et al. .............. 372/50.21 |
| 5,882,948 | A | * | 3/1999 | Jewell .................. 438/22 |
| 5,892,786 | A | | 4/1999 | Lott |
| 5,943,357 | A | * | 8/1999 | Lebby et al. ............ 372/50.21 |
| 5,974,071 | A | * | 10/1999 | Jiang et al. ............. 372/50.21 |
| 5,978,401 | A | * | 11/1999 | Morgan ................. 372/50.21 |
| 6,001,664 | A | * | 12/1999 | Swirhun et al. .......... 438/31 |
| 6,014,395 | A | * | 1/2000 | Jewell .................. 372/45.01 |
| 6,026,108 | A | | 2/2000 | Lim et al. |
| 6,034,981 | A | | 3/2000 | Kim |
| 6,483,862 | B1 | * | 11/2002 | Aronson et al. ......... 372/50.21 |
| 6,535,538 | B1 | * | 3/2003 | Lee et al. .............. 372/50.21 |
| 6,597,720 | B2 | | 7/2003 | Kondo |
| 6,777,718 | B2 | * | 8/2004 | Takagi .................. 257/98 |

FOREIGN PATENT DOCUMENTS

| DE | 198 07 783 A1 | 9/1999 |
| EP | 0 803 943 A2 | 10/1997 |

(Continued)

*Primary Examiner*—Minsun Oh Harvey
*Assistant Examiner*—Tod T. Van Roy
(74) *Attorney, Agent, or Firm*—Oliff & Berridge, PLC

(57) ABSTRACT

Exemplary embodiments of the present invention include surface-emitting type semiconductor lasers including photodetector sections, which have a degree of freedom in designing its structure and are capable of high-speed driving. A surface-emitting type semiconductor laser in accordance with exemplary embodiments the present invention includes a light emitting element section, and a photodetector section that is provided above the light emitting element section and includes an emission surface. The light emitting element section includes a first mirror, an active layer provided above the first mirror, and a second mirror provided above the active layer. The second mirror is formed from a first region and a second region. The second region contacts the photodetector section, and the second region has a resistance greater than a resistance of the first region.

13 Claims, 19 Drawing Sheets

FOREIGN PATENT DOCUMENTS

| | | |
|---|---|---|
| JP | A-9-507339 | 7/1997 |
| JP | A 10-135568 | 5/1998 |
| JP | A 2000-183444 | 6/2000 |
| JP | A-09-199795 | 2/2002 |
| JP | A 2002-504754 | 2/2002 |
| JP | A-2002-504754 | 2/2002 |
| JP | A-2002-504754 A | 2/2002 |
| WO | WO 99/43056 | 8/1999 |

* cited by examiner

F I G. 8
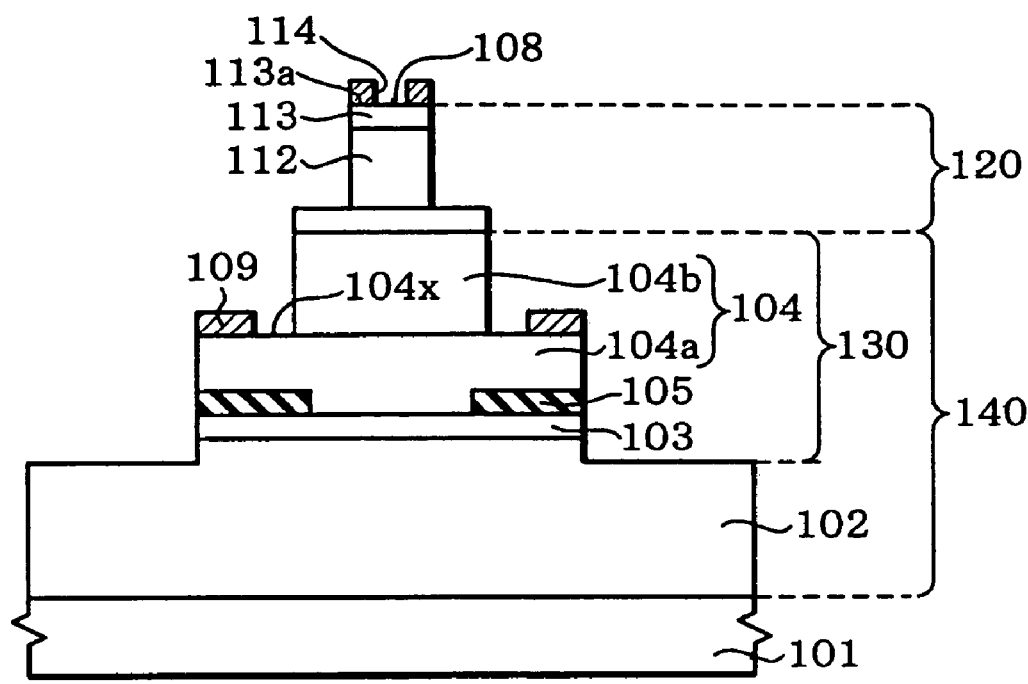

F I G. 1 0
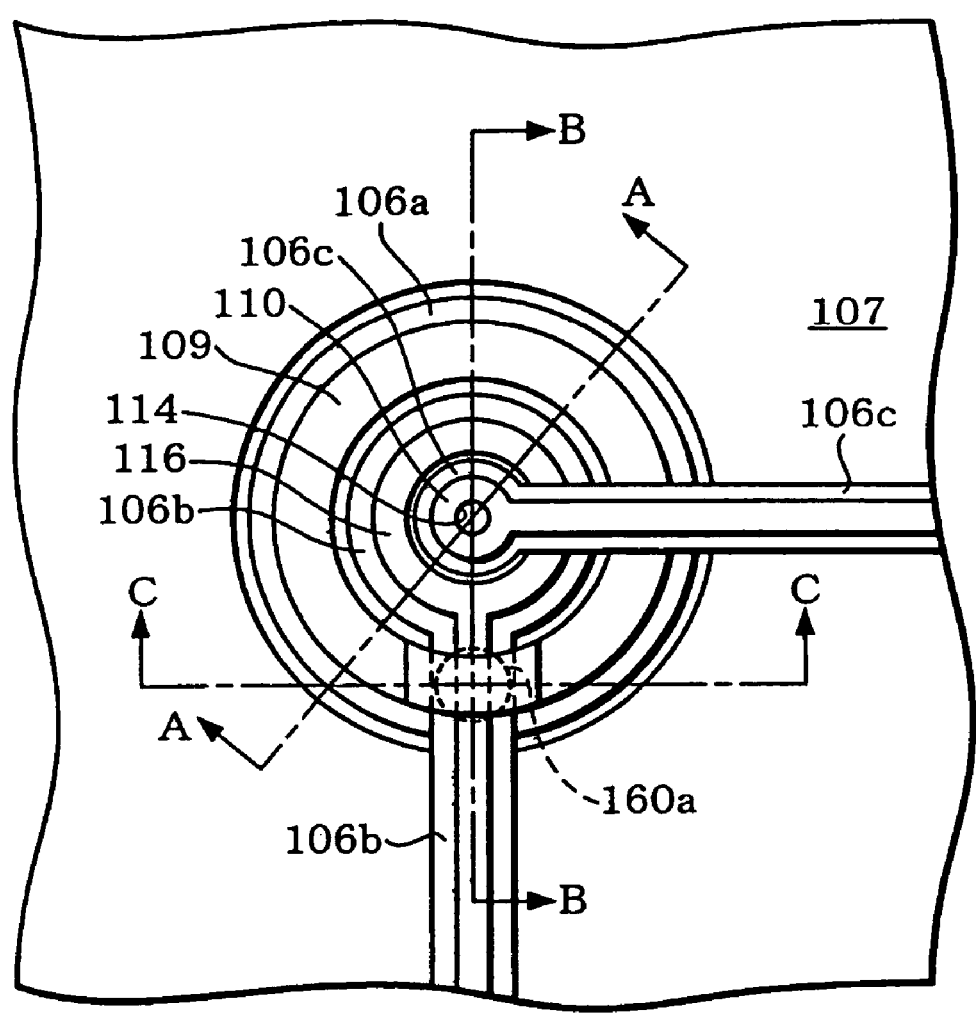

F I G. 1 4
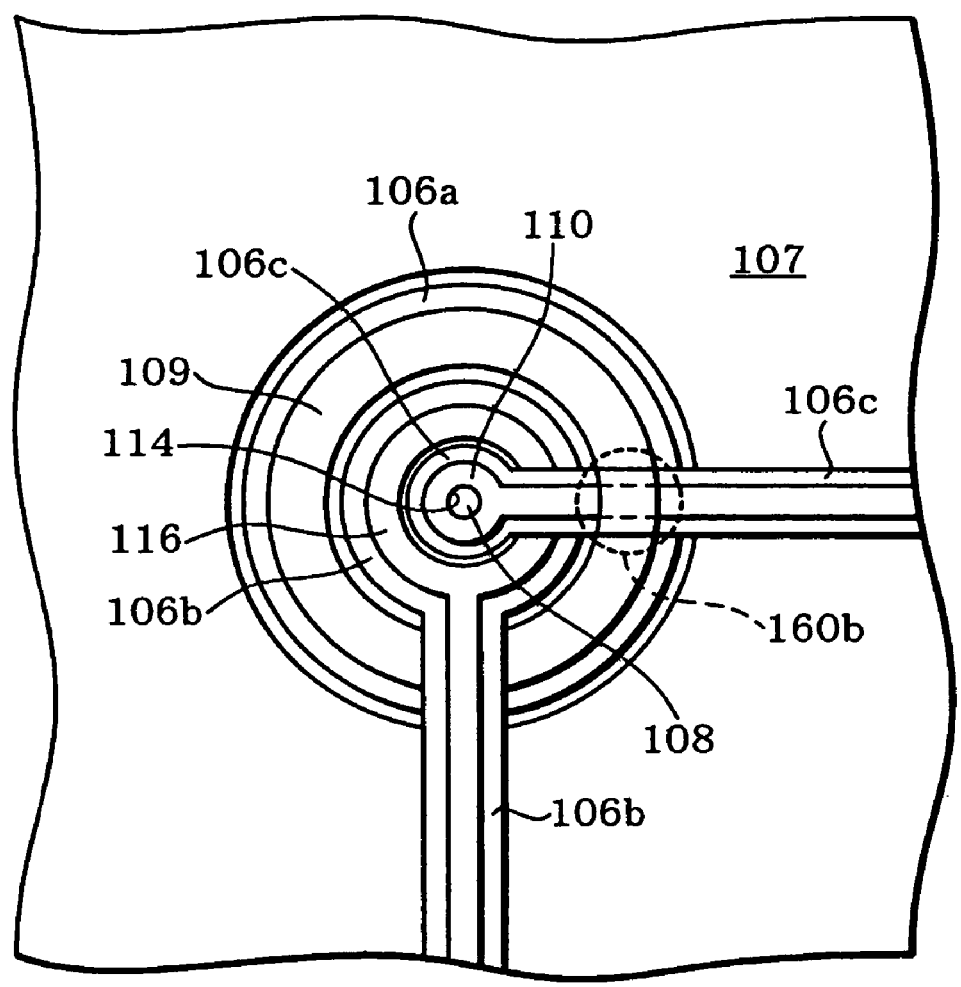

F I G. 1 7
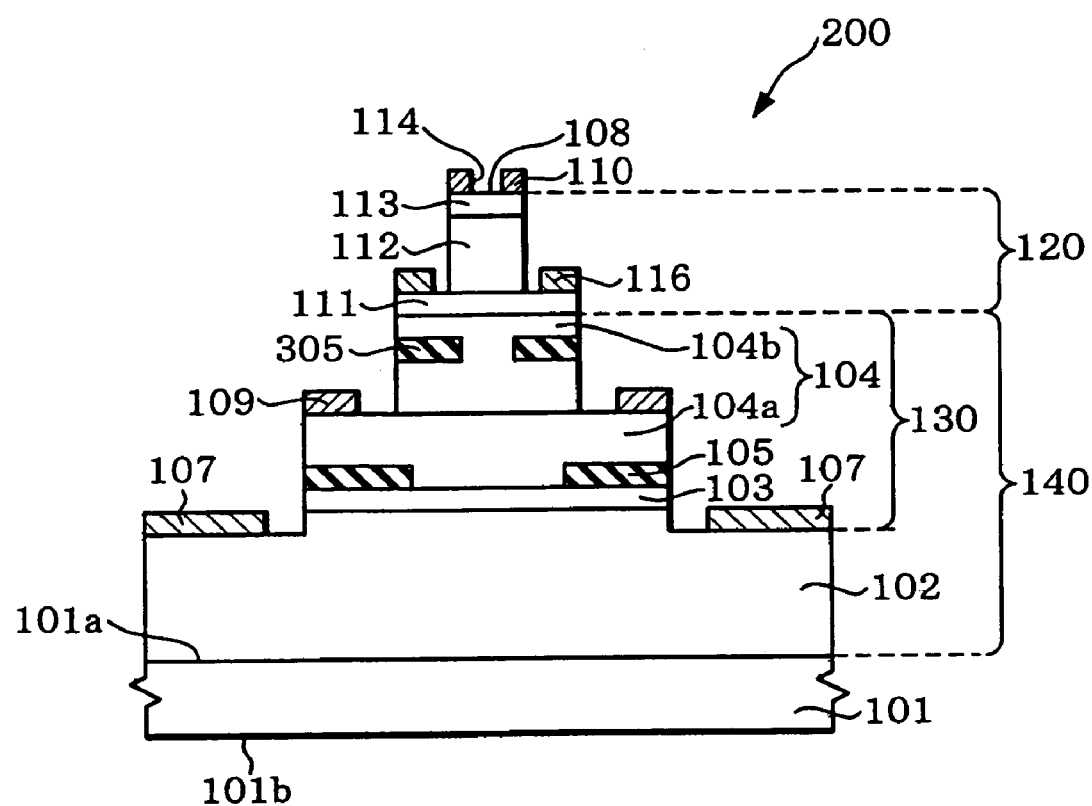

SURFACE-EMITTING TYPE SEMICONDUCTOR LASER, OPTICAL MODULE, AND OPTICAL TRANSMISSION DEVICE

BACKGROUND OF THE INVENTION

1. Field of Invention

The present invention relates to a surface-emitting type semiconductor laser, an optical module and an optical transmission device.

2. Description of Related Art

A surface-emitting type semiconductor laser has characteristics in which its light output varies depending on ambient temperatures. For this reason, in some cases, an optical module that uses a surface-emitting type semiconductor laser may be equipped with a photodetector function that detects a part of laser light emitted from the surface-emitting type semiconductor laser to thereby monitor light output values. For example, a photodetector section such as a photodiode or the like may be provided in a surface-emitting type semiconductor laser, such that a part of laser light emitted from the surface-emitting type semiconductor laser can be monitored within the same device as disclosed in related art document Japanese Laid-open Patent Application H10-135568. However, when a photodetector section is provided within a surface-emitting type semiconductor laser, the degree of freedom in selecting structures may be lowered because the structure of the surface-emitting type semiconductor laser is limited, in view of polarity of each of the layers that compose a section that contributes to generation of laser light (i.e., a light emitting element section) and the photodetector section, and the structure of the light emitting element section and the photodetector section.

Surface-emitting type semiconductor lasers can be driven at high-speeds, and by taking advantage of this characteristics, they are adopted in electronic devices and optical communication systems. Accordingly, operations at high speeds are also demanded for a surface-emitting type semiconductor laser equipped with an photodetector section.

SUMMARY OF THE INVENTION

Exemplary embodiments of the present invention provide a surface-emitting type semiconductor laser including a photodetector section, which has a high degree of freedom in selecting structures, and is capable of high-speed driving. Also, exemplary embodiments of the present invention provide an optical module and an optical transmission device, which includes the surface-emitting type semiconductor laser.

Exemplary embodiments of the invention include a surface-emitting type semiconductor laser including a light emitting element section and a photodetector section that is provided above the light emitting element section and includes an emission surface. The light emitting element section includes a first mirror, an active layer provided above the first mirror, and a second mirror provided above the active layer, the second mirror is formed from a first region and a second region, the second region contacts the photodetector section, and the second region has a resistance greater than a resistance of the first region.

By the surface-emitting type semiconductor laser in accordance with exemplary embodiments of the present invention, the second region has a higher resistance than that of the first region, has a high degree of freedom in selecting structure, and is capable of high-speed driving. Details thereof will be described in exemplary embodiments of the present invention.

The above-described surface-emitting type semiconductor laser can assume the following exemplary embodiments (1) through (11):

(1) According to exemplary embodiments, a first electrode and a second electrode to drive the light emitting element section can be included, and the second electrode can be in contact with the first region. According to this exemplary embodiment, a third electrode and a fourth electrode to drive the photodetector section can further be included, one of the first electrode and the second electrode and one of the third electrode and the fourth electrode can be electrically connected at an electrode connection section. Also, the electrode connection section can be provided in a region extending to an electrode pad except the light emitting element section and the photodetector section.

(2) According to exemplary embodiments, the second region can have a film thickness of 1 μm or greater.

(3) According to exemplary embodiments, the first region and the second region can include impurity of a first conductivity type, and a concentration of the impurity of the first conductivity type in the second region can be lower than a concentration of the impurity of the first conductivity type in the first region.

(4) According to exemplary embodiments, the concentration of the impurity in the second region can be less than $1 \times 10^{16}$ [cm$^{-3}$].

(5) According to exemplary embodiments, the second region can be semi-dielectric by further including impurity of a second conductivity type.

(6) According to exemplary embodiments, the second region can be comprised of intrinsic semiconductor. According to exemplary embodiments, "intrinsic semiconductor" is a semiconductor in which most of carriers involved in electric conduction are free electrons that are thermally excited from the valence band into the conduction band, or holes created in the same number in the valence band, changes in the carrier concentration due to the presence of impurity and/or lattice defects can be ignored.

(7) According to exemplary embodiments, the first region can include a current constriction layer.

(8) According to exemplary embodiments, the second region can include a layer to reflect spontaneous emission light.

(9) According to exemplary embodiments, the photodetector section can have a function to convert a part of light generated by the light emitting element section into a current.

(10) According to exemplary embodiments, the photodetector section can include a first contact layer, a light absorbing layer provided above the first contact layer, and a second contact layer provided above the light absorbing layer.

(11) According to exemplary embodiments, the light emitting element section and the photodetector section can have as a whole one of a pnpn structure and a npnp structure.

[Optical Module and Optical Transmission Device]

An optical module in accordance with exemplary embodiments of the present invention includes the above-described surface-emitting type semiconductor laser, and a light waveguide. Also, an optical transmission device in accordance with exemplary embodiments of the present invention includes the above-described optical module.

BRIEF DESCRIPTION OF THE DRAWINGS

FIG. 8 is a schematic cross-sectional view showing a step of manufacturing the surface-emitting type semiconductor laser shown in FIG. 1;

FIG. 10 is a schematic plan view showing an electrode structure of the surface-emitting type semiconductor laser shown in FIG. 1, when the connection method indicated in FIG. 9A is used;

FIG. 14 is a schematic plan view showing an electrode structure of the surface-emitting type semiconductor laser shown in FIG. 1, when the connection method indicated in FIG. 9B is used;

FIG. 17 is a schematic that shows a cross-sectional view of a surface-emitting type semiconductor laser in accordance with a second exemplary embodiment of the present invention;

DETAILED DESCRIPTION OF PREFERRED EMBODIMENTS

Exemplary embodiments of the present invention will be described below with reference to the accompanying drawings.

[First Exemplary Embodiment]

1. Structure of Optical Device

Figure 1:
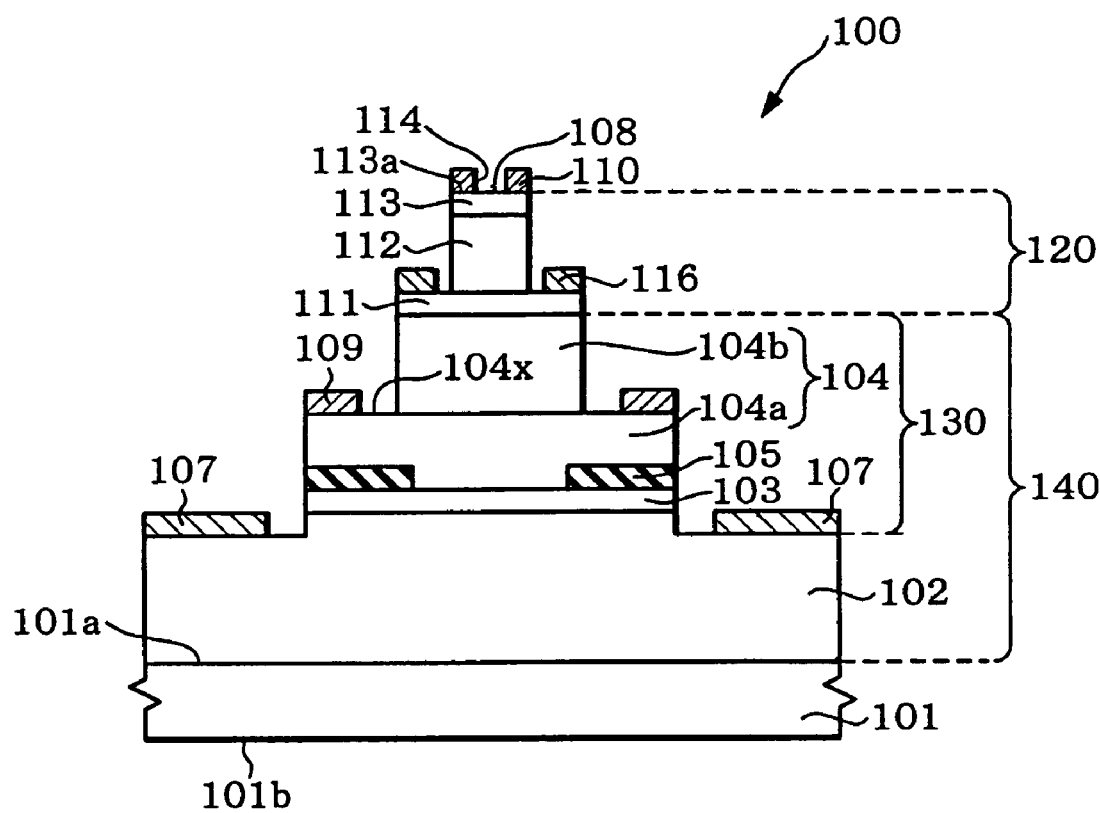
FIG. 1 is a schematic that shows a cross-sectional view of a surface-emitting type semiconductor laser in accordance with a first exemplary embodiment of the present invention.
Figure 2:
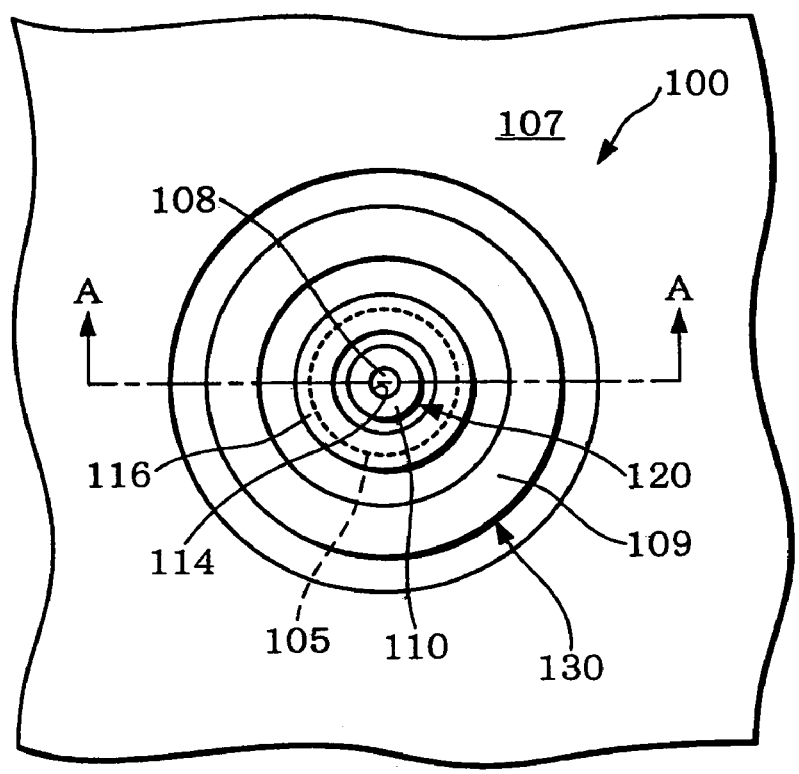
FIG. 2 is a schematic that shows a plan view of the surface-emitting type semiconductor laser shown in FIG. 1.

FIG. 1 is a schematic that shows a view of a surface-emitting type semiconductor laser (hereinafter also referred to as "surface-emitting laser") 100 in accordance with a first exemplary embodiment of the present invention. Also, FIG. 2 is a schematic that shows a view of the surface-emitting laser 100 shown in FIG. 1.

The surface-emitting laser 100 of the present exemplary embodiment includes, as shown in FIG. 1, a light emitting element section 140 and a photodetector section 120. In this surface-emitting laser 100, the light emitting element section 140 generates laser light, which is emitted from an emission surface 108 provided on the photodetector section 120. Also, the photodetector section 120 has a function to convert a part of laser light generated at the light emitting element section 140 into a current. The light emitting element section 140 and the photodetector section 120 are described below.

(Light Emitting Element Section)

The light emitting element section 140 is formed on a semiconductor substrate (an n-type GaAs substrate in the present exemplary embodiment) 101. The light emitting element section 140 forms a vertical resonator (hereinafter referred to as a "resonator"). Also, the light emitting element section 140 can include a columnar semiconductor deposition body (hereafter referred to as a "columnar section") 130.

The light emitting element section 140 is formed from, for example, a distributed reflection type multilayer mirror of 40 pairs of alternately laminated n-type $Al_{0.9}Ga_{0.1}As$ layers and n-type $Al_{0.15}Ga_{0.85}As$ layers (hereafter called a "first mirror") 102, an active layer 103 composed of GaAs well layers and $Al_{0.3}Ga_{0.7}As$ barrier layers in which the well layers include a quantum well structure composed of three layers, and a distributed reflection type multilayer mirror of 25 pairs (hereafter called a "second mirror") 104, which are successively stacked in layers.

A portion among the light emitting element section 140 extending from the second mirror 104 to an intermediate point of the first mirror 102 of the surface-emitting laser 100 is etched in a circular shape, as viewed in a direction perpendicular to the emission surface 108, to form a columnar portion 130. It is noted that, in the present exemplary embodiment, the columnar portion 130 has a plan configuration that is circular, but can have any arbitrary configuration.

The second mirror 104 is composed of a first region 104a and a second region 104b. As shown in FIG. 1, the second region 104b is provided above the first region 104a. Also, the second region 104b is in contact with the photodetector section 120 (more specifically, a first contact layer 111 of the photodetector section 120). Further, in the surface-emitting laser 100, as shown in FIG. 1 and FIG. 2, the first region 104a has a cross section larger than a cross section of the second region 104b, when cut in planes parallel with a surface 101a of the semiconductor substrate 101. As a result, the columnar section 130 has a step difference formed by the first region 104a and the second region 104b of the second mirror 104. In other words, the second region 104b is provided in a part of an upper surface 104x of the first region 104a. A second electrode 109 (to be described below) is further provided on the upper surface 104x of the first region 104a.

The second region 104b has a higher resistance than that of the first region 104a. For example, the second region 104b may be composed of intrinsic semiconductor. In the surface-emitting laser 100 of the present exemplary embodiment, both of the first region 104a and the second region 104b include impurity of a first conductivity type (p type), and the concentration of the p-type impurity of the second region 104b is lower than the concentration of the p-type impurity of the first region 104a. It is noted that, in the present exemplary embodiment, the first conductivity type is p-type, but the first conductivity type can be n-type. This similarly applies to other exemplary embodiments to be described below.

Also, the impurity concentration of the second region 104b may preferably be less than $1 \times 10^{16}$ [cm$^{-3}$]. Furthermore, the second region 104b may preferably have a film thickness of 1 μm or greater.

More specifically, the first region 104a is formed from 5 pairs of alternately laminated p-type $Al_{0.9}Ga_{0.1}As$ layers and p-type $Al_{0.15}Ga_{0.85}As$ layers, the second region 104b is formed from 20 pairs of alternately laminated p-type $Al_{0.9}Ga_{0.1}As$ layers and p-type $Al_{0.15}Ga_{0.85}As$ layers. In this case, the concentration of the p-type impurity of the first region 104a is, for example, $1 \times 10^{18}$ [cm$^{-3}$], and the concentration of the p-type impurity of the second region 104b is, for example, $1 \times 10^{15}$ [cm$^{-3}$].

It is noted that the composition of each of the layers and the number of the layers forming the first mirror 102, the active layer 103 and the second mirror 104 are not limited to the above.

At least the first region 104a among the second mirror 104 is formed to be p-type by, for example, doping C, and the first mirror 102 is formed to be n-type by, for example, doping Si. Accordingly, the first region 104a of the p-type second mirror 104, the active layer 103 in which no impurity is doped, and the n-type first mirror 102 forms a pin diode.

Also, a current constricting layer 105, which is composed of aluminum oxide, is formed in a region near the active layer 103 among the first region 104a of the second mirror 104. The current constricting layer 105 is formed in a ring shape. In other words, the current constricting layer 105 has cross sections that are concentric, when cut in a plane parallel with the surface 101a of the semiconductor substrate 101 shown in FIG. 1.

Further, the light emitting element section 104 is provided with a first electrode 107 and a second electrode 109. The first electrode 107 and the second electrode 109 are used for applying a voltage to the light emitting element section 104 to drive it. The second electrode 109 is provided on an upper surface 140a of the light emitting element section 140. More specifically, as shown in FIG. 2, the second electrode 109 has a plane configuration in a ring shape. Also, the first electrode 107 is provided in a manner to encircle the columnar section 130, and the second electrode 109 is provided in a manner to encircle the second region 104b of the second mirror 104 and the optical device section 120. In other words, the columnar section 130 is provided inside the first electrode 107, and the second region 104b of the second mirror 104 and the optical device section 12 are provided inside the second electrode 109. It is noted that the first electrode 107 can be formed in any plane configuration.

Although the present exemplary embodiment is described as having the first electrode 107 provided on the first mirror 102, the first electrode 107 can be formed on the back surface 101b of the semiconductor substrate 101. This similarly applies to surface-emitting lasers in accordance with other exemplary embodiments to be described below.

For instance, the first electrode 107 consists of a multi-layer film of an alloy of Au and Ge, and Au. Also, the second electrode 109 consists of a multilayer film of Pt, Ti, and Au, for instance. An electric current is injected into the active layer 103 by the first electrode 107 and the second electrode 109. The material to form the first electrode 107 and the second electrode 109 is not limited to the aforementioned material, and, for instance, an alloy of Au and Zn, etc. can be used.

(Photodetector Section)

The photodetector section 120 is provided on the light emitting element section 140, and has the emission surface 108. Moreover, the photodetector section 120 includes a first contact layer 111, a photoabsorption layer 112, and a second contact layer 113. The first contact layer 111 is provided on the second mirror 104 of the light emitting element section 140, the photoabsorption layer 112 is provided on the first contact layer 111, and the second contact layer 113 is provided on the photoabsorption layer 112. Furthermore, in the case of the photodetector section 120 of the present exemplary embodiment, the plane configuration of the first contact layer 111 is shown to be greater than the plane configuration of the photoabsorption layer 112 or the second contact layer 113 (see FIG. 1 and FIG. 2). Also, a third electrode 116 is provided on the first contact layer 111. In other words, the first contact layer 111 is in contact with the third electrode 116.

For example, the first contact layer 111 can be formed from an n-type GaAs layer. The photoabsorption layer 112 can be formed from, for example, a GaAs layer into which impurity is not introduced. The second contact layer 113 can be formed from a p-type GaAs layer. More specifically, the first contact layer 111 is made n-type by Si doping, for example, and the second contact layer 113 is made p-type by C doping, for example. Therefore, a pin diode is formed with the n-type first contact layer 111, the photoabsorption layer 112 in which no impurity is doped, and the p-type second contact layer 113.

The photodetector section 120 is provided with the third electrode 116 and a fourth electrode 110. The third electrode 116 and the fourth electrode 110 are used for driving the photodetector section 120. Also, in the surface-emitting laser 100 of the present exemplary embodiment, the third electrode 116 can be formed with the same material as that of the first electrode 107, and the fourth electrode 110 can be formed with the same material as that of the second electrode 109.

The fourth electrode 110 is provided on an upper surface of the photodetector section 120 (on the second contact layer 113). The fourth electrode 110 is provided with an aperture section 114, and a bottom surface of the aperture section 114 defines the emission surface 108. Accordingly, the shape and the size of the emission surface 108 can be optionally set by appropriately setting the plane configuration and the size of the aperture section 114. The present exemplary embodiment indicates, as shown in FIG. 1, a case in which the emission surface 108 is circular.

(Overall Configuration)

In the surface-emitting laser 100 of the present exemplary embodiment, the n-type first mirror 102 and the p-type second mirror 104 of the light emitting element section 140, and the n-type first contact layer 111 and the p-type second contact layer 113 of the photodetector section 120 form a npnp structure as a whole. In other words, the surface-emitting laser 100 has three p-n junctions, and the conduction type of the semiconductor changes three times in the structure. It should be noted that, for example, the p-type and n-type characteristics of each of the semiconductor layers may be interchanged to form a pnpn structure as a whole. These features can be similarly applied to surface-emitting lasers in accordance with other exemplary embodiments to be described below.

The polarity of the second region 104b of the second mirror 104 is not particularly limited. In the surface-emitting laser 100 of the present exemplary embodiment, the first conductive type (p-type) is introduced in the second region 104b. The second region 104b can further include impurities of the second conductivity type (n-type). In this case, the concentration of the first conductivity type impurity and the concentration of the second conductivity type impurity may be made substantially equal to each other in the second region 104b, such that the second region 104b can be made to be semi-insulating. Also, the concentration of the first conductivity type impurity can be made greater than the concentration of the second conductivity type impurity in the second region 104b, such that the second region 104b can be of the first conductivity type, or the concentration of the second conductivity type impurity can be made greater than the concentration of the first conductivity type impurity in the second region 104b, such that the second region 104b can be of the second conductivity type.

The photodetector section 120 has a function to monitor outputs of light generated at the light emitting element section 140. More specifically, the photodetector section 120 converts light generated at the light emitting element section 140 to an electrical current. Outputs of light generated by the light emitting element section 140 can be detected by values of the electrical current.

More specifically, in the photodetector section 120, a part of light generated at the light emitting element section 140 is absorbed by the photoabsorption layer 112. By the absorbed light, light excitation occurs at the photoabsorption layer 112, and electrons and holes are generated. By an electric field applied from outside the device, the electrodes move to the third electrode 116, and the holes move to the fourth electrode 110. As a result, in the photodetector section 120, a current is generated in a direction from the first contact layer 111 to the second contact layer 113.

Also, light outputs of the light emitting element section 140 are mainly determined by bias voltages that are applied to the light emitting element section 140. In the surface-emitting laser 100, light outputs of the light emitting element section 140 may substantially change depending of the ambient temperature and the service life of the light emitting element section 140, like a related art surface-emitting laser. For this reason, light outputs of the light emitting element section 140 are monitored by the photodetector section 120. In other words, by adjusting the voltage value to be applied to the light emitting element section 140 based on values of current generated at the photodetector section 120, to thereby adjust values of current flowing in the light emitting element section 140, a predetermined light output level can be maintained at the light emitting element section 140. A control to feed back light outputs of the light emitting element section 140 to voltage values to be applied to the light emitting element section 140 can be implemented by using an external electronic circuit (a drive circuit (not shown)).

General operations of the surface-emitting laser 100 of the present exemplary embodiment are described below. It is noted that the following method for operating the surface-emitting laser 100 is described as an example, and various changes can be made without departing from the subject matter of the present invention.

When applying a voltage in a forward direction to the pin diode between the first electrode 107 and the second electrode 109, recombinations of electrons and holes occur in the active layer 103 of the light emitting element section 140, thereby causing emission of light due to the recombinations. Stimulated emission occurs during the period the generated light reciprocates between the second mirror 104 and the first mirror 102, whereby the light intensity is amplified. When the optical gain exceeds the optical loss, laser oscillation occurs, whereby laser light is generated at the active layer 103. The laser light is emitted from the second mirror 104 of the light emitting element section 140, and enters the first contact layer 111 of the photodetector section 120.

Next, in the photodetector section 120, light that has entered the first contact layer 111 next enters the photoabsorption layer 112. A part of the entered light is absorbed by the photoabsorption layer 112, such that photoexcitation occurs in the photoabsorption layer 112 whereby electrons and holes are generated. By an electric field applied from outside the device, the electrons move to the third electrode 116, and the holes move to the fourth electrode 110. As a result, in the photodetector section 120, a current (photoelectric current) is generated in a direction from the first contact layer 111 to the second contact layer 113. By measuring the current values, light outputs of the light emitting element section 140 can be detected. Then, the light that has passed the photodetector section 120 is emitted from the emission surface 108.

By the surface-emitting laser 100 of the present exemplary embodiment, a part of light output of the light emitting element section 140 is monitored by the photodetector section 120 and the result is fed back to the drive circuit, whereby variations in the output due to temperatures or the like can be corrected, and therefore stable light output can be obtained.

Method of Manufacturing Optical Device

Next, one example of the method for manufacturing the surface-emitting laser 100 in accordance with a first exemplary embodiment of the present invention will be described with reference to FIG. 3-FIG. 8. FIG. 3-FIG. 8 are schematics showing a process for manufacturing the surface-emitting laser 100 shown in FIG. 1, each of which corresponds to the schematics shown in FIG. 1.

Figure 3:
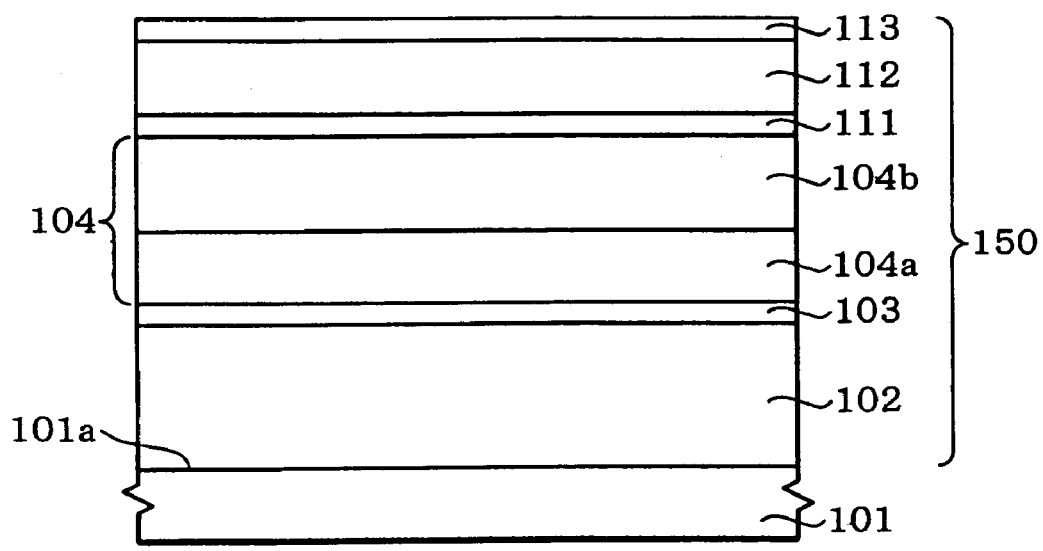
FIG. 3 is a cross-sectional view showing a step of manufacturing the surface-emitting type semiconductor laser shown in FIG. 1.

(1) First, as shown in FIG. 3, on the surface 101a of the semiconductor substrate 101 formed of n-type GaAs, a semiconductor multilayer film 150 is formed by epitaxial growth while varying the composition (see FIG. 3). It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, a second mirror 104 composed of a first region 104a and a second region 104b of 5 pairs and 20 pairs of alternately laminated p-type $Al_{0.9}Ga_{0.1}As$ layers and p-type $Al_{0.15}Ga_{0.85}As$ layers, respectively, a first contact layer 111 composed of n-type GaAs, a photoabsorption layer 112 composed of GaAs without impurities doped, and a second contact layer 113 composed of p-type GaAs, which are successively stacked in layers on the semiconductor substrate 101 to thereby form the semiconductor multilayer film 150 (see FIG. 3).

When depositing the second mirror 104, at least one layer adjacent to the active layer 103 is formed as an AlAs layer or an AlGaAs layer having Al composition being 0.95 or greater. This layer becomes a current constricting layer 105 when oxidized later (see FIG. 7). Also, when a second electrode 109 is formed in a later step, at least an area near the portion of the first region 104a of the second mirror 104 which contacts the second electrode 109 may preferably be formed to have a high carrier density, such that ohm contact can be readily made with the second electrode 109. Similarly, at least an area near the portion of the first contact layer 111 which contacts the third electrode 116, and at least an area near the portion of the second contact layer 113 which contacts the fourth electrode 110 may preferably be formed to have a high carrier density, such that ohm contact can be readily made with the third electrode 116 and the fourth electrode 110, respectively.

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may preferably be 450° C.-800° C. Also, the time required when the epitaxial growth is conducted is appropriately decided just as the temperature is decided. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 4:
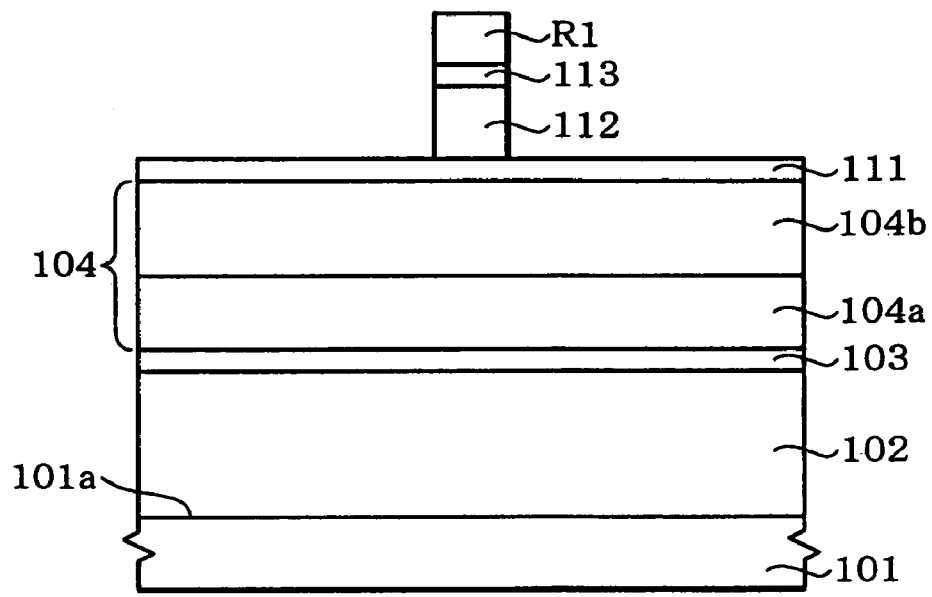
FIG. 4 is a schematic cross-sectional view showing a step of manufacturing the surface-emitting type semiconductor laser shown in FIG. 1.

(2) Next, the second contact layer 113 and the photoabsorption layer 112 are patterned into predetermined configurations (see FIG. 4).

First, photoresist (not shown) is coated on the semiconductor multilayer film 150, and then the photoresist is patterned by a photolithography method, thereby forming a resist layer R1 having a specified pattern.

(3) Then, the second contact layer 113 and the photoabsorption layer 112 are etched by, for example, a dry etching method, using the resist layer R1 as a mask. By this, the second contact layer 113 and the photoabsorption layer 112 having the same plane configuration as that of the second contact layer 113 are formed. Then, the resist R1 is removed.

Figure 5:
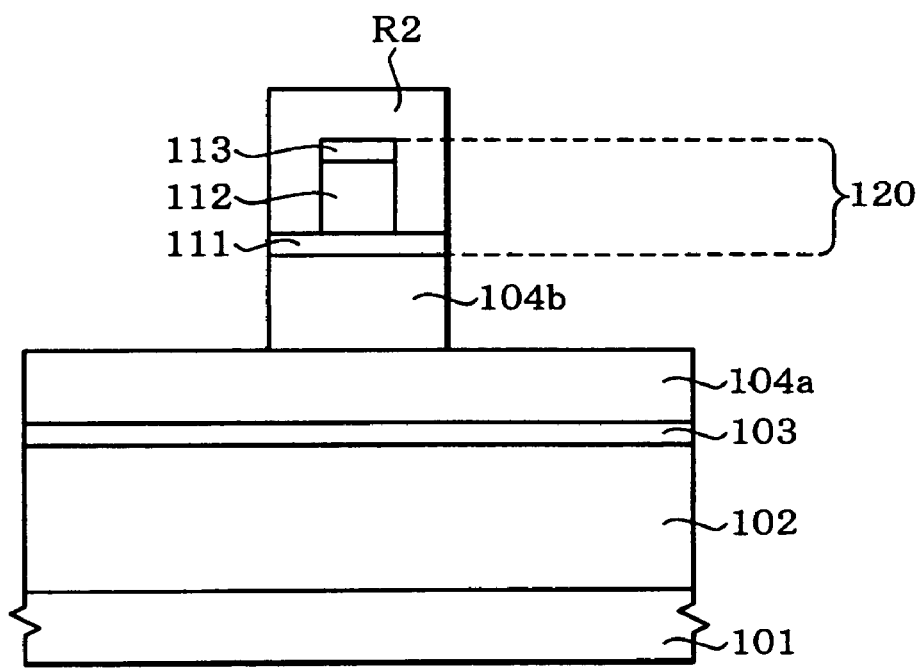
FIG. 5 is a schematic cross-sectional view showing a step of manufacturing the surface-emitting type semiconductor laser shown in FIG. 1.

(3) Then, the first contact layer 111 and the second mirror 104 are patterned into a specified configuration (see FIG. 5). More specifically, first, photoresist (not shown) is coated on the first contact layer 111 and the second contact layer 113, and then the photoresist is patterned by a photolithography method, thereby forming a resist layer R2 having a specified pattern (see FIG. 5).

Then, the first contact layer 111 and the second region 104b of the second mirror 104 are etched by, for example, a dry etching method, using the resist layer R2 as a mask. By the steps described above, the photodetector section 120 is formed, as shown in FIG. 5. The photodetector section 120 includes the second contact layer 113, the photoabsorption layer 112 and the first contact layer 111. Further, the plane configuration of the first contact layer 111 can be formed to be larger than the plane configuration of the second contact layer 113 and the photoabsorption layer 112. Then, the resist R2 is removed.

In the steps described above, the second contact layer 113 and the photoabsorption layer 112 are patterned, and then the first contact layer 111 is patterned. However, the first contact layer 111 may be patterned, and then the second contact layer 113 and the photoabsorption layer 112 may be patterned to form the photodetector section 120.

Figure 6:
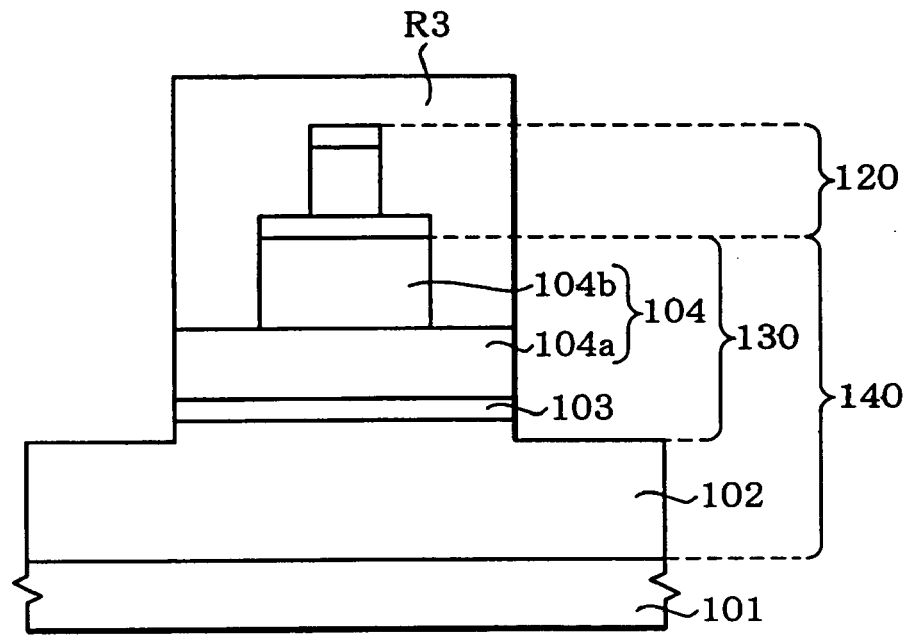
FIG. 6 is a schematic cross-sectional view showing a step of manufacturing the surface-emitting type semiconductor laser shown in FIG. 1.

(4) Then, by patterning, the light emitting element section 140 including a columnar section 130 is formed (see FIG. 6). More specifically, first, photoresist (not shown) is coated on the first region 104a of the second mirror 104 and the photodetector section 120, and then the photoresist is patterned by a photolithography method, thereby forming a resist layer R3 having a specified pattern (see FIG. 6).

Next, the first region 104a of the second mirror 104, the active layer 103, and a part of the first mirror 102 are etched by, for example, a dry etching method, using the resist layer R3 as a mask. As a result, as shown in FIG. 6, a columnar section 130 is formed. By the steps described above, a resonator (the light emitting element section 140) including the columnar section 130 is formed on the semiconductor substrate 101. In other words, a stacked layered body of the photodetector section 120 and the light emitting element section 140 is formed. Then, the resist layer R3 is removed.

Although in the case of the present exemplary embodiment described above, the photodetector section 120 is first formed, and then the columnar section 130 is formed. However, the columnar section 130 may be formed first, and then the photodetector section 120 may be formed.

Figure 7:
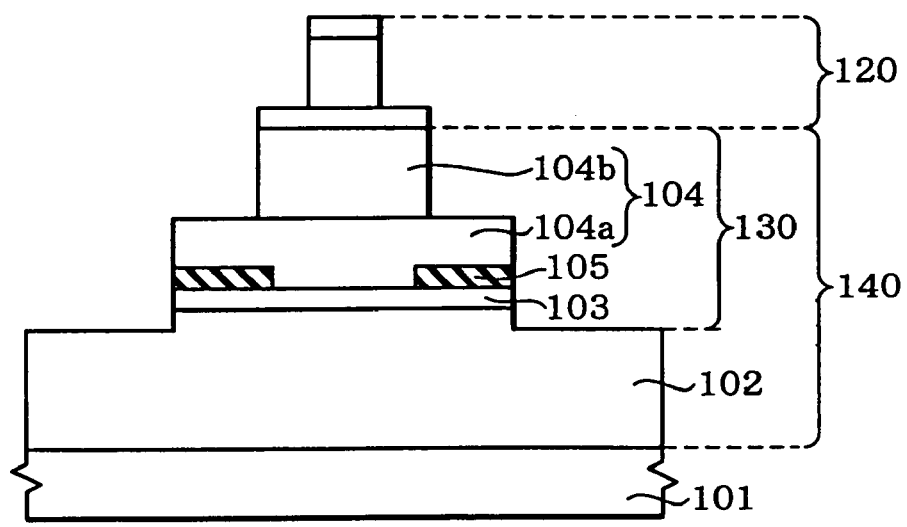
FIG. 7 is a schematic cross-sectional view showing a step of manufacturing the surface-emitting type semiconductor laser shown in FIG. 1.

(5) Next, by placing the semiconductor substrate 101 on which the light emitting element section 140 and the photodetector section 120 are formed through the aforementioned process in a water vapor atmosphere at about 400° C., for example, the layer having a high rate of Al composition provided by the aforementioned process in the first region 104a of the second mirror 104 is oxidized from its side surface, thereby forming a current constricting layer 105 (see FIG. 7).

The oxidation rate depends on the temperature of the furnace, the amount of water vapor supply, and the Al composition and the film thickness of the layer to be oxidized (the layer in which the rate of Al composition is high). In a surface-emitting laser that has a current constricting layer formed by oxidation, an electric current flows, when it is driven, only in a portion where the current constricting layer is not formed (i.e., a portion that has not been oxidized). Therefore, the current density can be controlled by controlling the range of the current constricting layer 105 to be formed in the process of forming the current constricting layer by oxidation.

Also, the diameter of the current constricting layer 105 may preferably be controlled such that a major part of the light emitted from the light emitting element section 140 enters the first contact layer 111.

(6) Next, a second electrode 109 is formed on an upper surface 104x of the first region 104a of the second mirror 104, and a fourth electrode 110 is formed on an upper surface of the photodetector section 120 (an upper surface 113a of the second contact layer 113) (see FIG. 8).

First, an upper surface 104x of the first region 104a and an upper surface 113a of the second contact layer 113 are washed by using a plasma treatment method, etc. if necessary before the second electrode 109 and the fourth electrode 110 are formed. As a result, a device of more stable characteristics can be formed.

Next, a multilayer film of Pt, Ti, and Au, for example, (not shown) is formed by, for example, a vacuum deposition method. Next, the second electrode 109 and the fourth electrode 110 are formed by removing the multilayer film other than specified positions by a lift-off method. In this case, a portion where the above-mentioned multilayer film is not formed is formed in the upper surface 113a in the second contact layer 113. This portion becomes an opening section 114, and the bottom of the opening section 114 becomes an emission surface 108. It is noted that a dry etching method can be used in the above-mentioned process instead of the lift-off method. Further, although the second electrode 109 and the fourth electrode 110 are patterned at the same time in the above-mentioned process, the second electrode 109 and the fourth electrode 110 can be individually formed.

(7) Next, a first electrode 107 is formed on the first mirror 102 of the light emitting element section 140 by patterning a multilayer film of Au and an alloy of Au and Ge, for example, by a similar method, whereby the third electrode 116 is formed on the first contact layer 111 of the photodetector section 120 (see FIG. 1).

Next, the annealing treatment is conducted. The temperature of the annealing treatment depends on the electrode material. This is usually conducted at about 400° C. for the electrode material used in the present exemplary embodiment. The first electrode 107 and the third electrode 116 are formed with the above-described process (see FIG. 1). It is noted here that the first electrode 107 and the third electrode 116 may be patterned and formed at the same time, but the first electrode 107 and the third electrode 116 may be formed individually.

The surface-emitting laser 100 including the light emitting element section 140 and the photodetector section 120 is obtained by the above-mentioned process (see FIG. 1).

4. Actions and Effects

Actions and effects of the surface-emitting laser 100 in accordance with the present exemplary embodiment will be described below.

(1) Actions and Effects 1

First, the structure of a related art surface-emitting laser 900 will be explained before describing the actions and effects of the surface-emitting laser 100 in accordance with the present exemplary embodiment.

(A) Related Art Surface-emitting Laser

Figure 23:
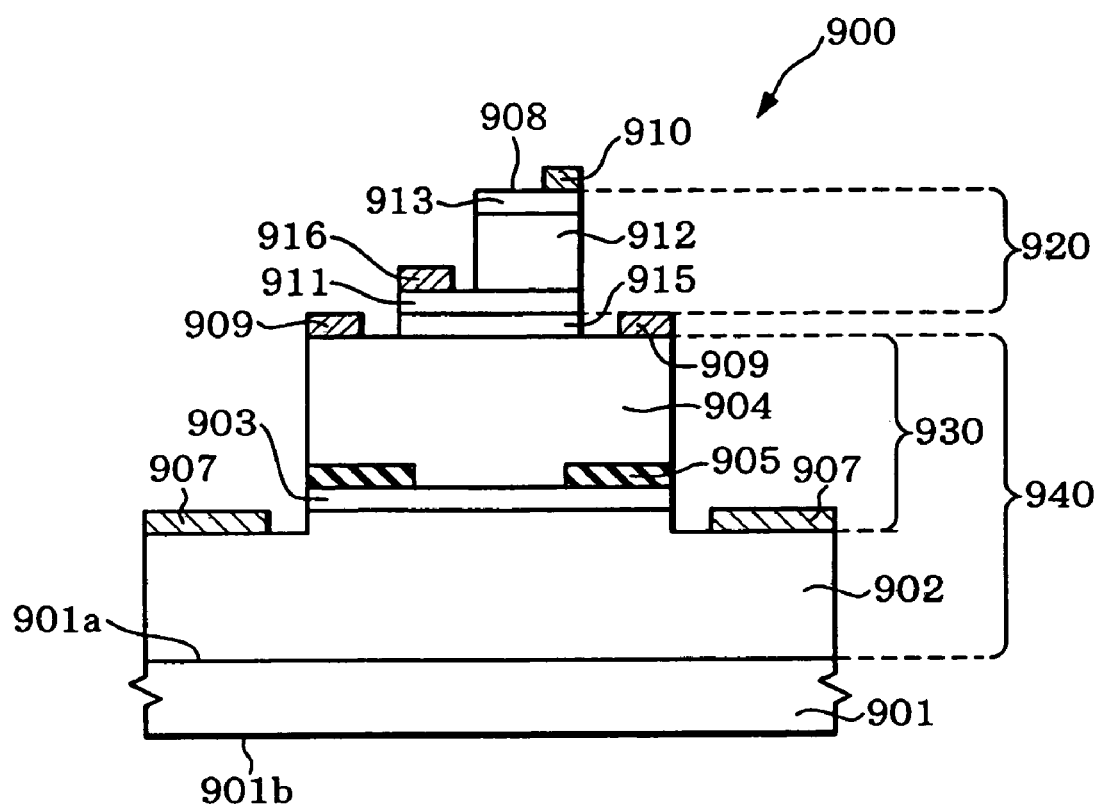
FIG. 23 is a schematic that shows a cross-sectional view of one example of a related art surface-emitting type semiconductor laser.

FIG. 23 is a schematic that shows a related art surface emission laser 900. The surface-emitting laser shown in FIG. 23 includes a light emitting element section 940 and a photodetector section 920. The light emitting element section 940 is formed on a semiconductor substrate 901, and is composed of a multilayer of an n-type first mirror 902, an active layer 903, and a p-type second mirror 904 stacked in layers in this order. The photodetector section 920 is provided on the light emitting element section 940, and is composed of an n-type first contact layer 911, a photoabsorption layer 912 in which impurities are not introduced, and a p-type second contact layer 913, which are sequentially stacked in layers. Further, a first electrode 907 and a second electrode 909 to drive the light emitting element section 940 are provided, and a third electrode 916 and a fourth electrode 910 to drive the photodetector section 920 are provided.

Moreover, a dielectric layer 915 is provided between the light emitting element section 940 and the photodetector section 120. For instance, this dielectric layer 915 is formed from a layer including aluminum oxide, and is formed by oxidizing a layer including Al from its side. Such a surface emitting laser 900 including a dielectric layer 915 is described in, for example, related art documents Japanese Tokuhyo (Japanese Translation of PCT International Application) 2002-504754 and Tokkai (Laid-open Patent Application) 2000-183444.

In this surface emission laser 900, a voltage is impressed between the first electrode 907 and the second electrode 909 to drive the light emitting element 940. On the other hand, a prescribed voltage is impressed also between the third electrode 916 and the fourth electrode 910 to drive the photodetector section 920.

On the other hand, the dielectric layer 915 is obtained by oxidizing a layer (not shown) including Al. When the dielectric layer 915 is formed by this method, the layer including Al before it is oxidized is formed "sparsely" so that oxygen may smoothly enter the layer when oxidized and the oxidation may progress easily. Therefore, the dielectric layer 915 obtained by oxidation is "sparse", such that its reliability is low and its mechanical strength is small. Therefore, to secure the reliability and mechanical strength, the film thickness of the dielectric layer 915 needs to be small. However, when the dielectric layer 915 with a small film thickness is provided between the light emitting element section 940 and the photodetector section 920, a large parasitic capacitance is generated between the light emitting element section 940 and the photodetector section 920. The generation of this parasitic capacitance becomes an obstruction to a high-speed drive.

(B) Surface-Emitting Laser of the Present Exemplary Embodiment

In contrast, in the surface-emitting laser 100 in accordance with the present exemplary embodiment, the second mirror 104 is formed from the first region 104a and the second region 104b, the second region 104b contacts the photodetector section 120, and the second region 104b has a higher resistance that that of the first region 104a. Moreover, this second region 104b can be formed by an ordinary epitaxial growth method. Consequently, the second region 104b can be formed with a large film thickness. As a result, the parasitic capacitance generated between the light emitting element section 140 and the photodetector section 120 can be reduced.

In addition, the second region 104b can be formed by an epitaxial growth method just like an ordinary mirror. As a result, the surface emission laser 100 of the present exemplary embodiment excels more at least in reliability and mechanical strength, compared to the dielectric layer 915 of the related art surface emission laser 900 obtained by oxidizing a layer including Al.

(2) Actions and Effects 2

Moreover, according to the surface emission laser 100 of the present exemplary embodiment, by electrically connecting one of the first electrode 107 and the second electrode 109 of the light emitting element 140 to one of the third electrode 116 and the fourth electrode 110 of the photodetector section 120 at an electrode connection section, a three terminal structure can be provided.

Figure 11:
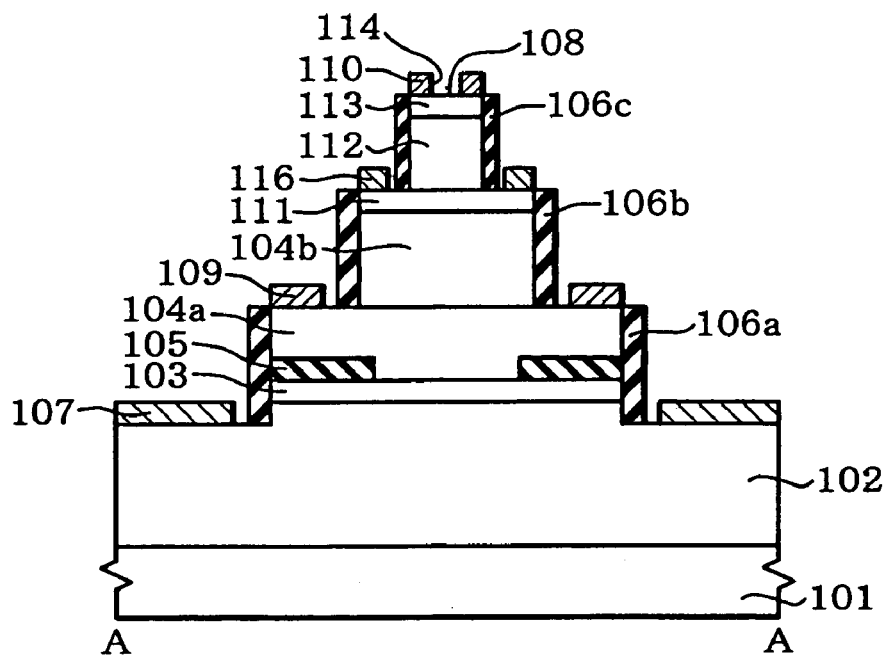
FIG. 11 is a schematic that shows a cross-sectional views taken along a line A—A of the surface-emitting type semiconductor laser shown in FIG. 10.

FIGS. 9A–9D are schematics that show the connection method of the above-described electrode when the surface emission laser 100 has a three terminal structure. Electrical connection structures that realize the electrode connection method indicated in FIG. 9A–FIG. 9D are schematically shown in FIG. 10 and FIG. 14–FIG. 16, respectively. Further, FIG. 11–FIG. 13 are schematics that show views taken along a line A—A, line B—B, and line C—C indicated in the view of FIG. 10, respectively.

There are four ways of electrically connecting one of the first electrode 107 and the second electrode 109 of the light emitting element section 140 to one of the third electrode 116 and the fourth electrode 110 of the photodetector section 120, which are shown in FIG. 9A–FIG. 9D as Connection Methods 1 through 4, respectively. FIG. 9A–FIG. 9D indicate electrode connection sections 160a–160d, respectively.

(A) Connection Method 1

Figure 12:
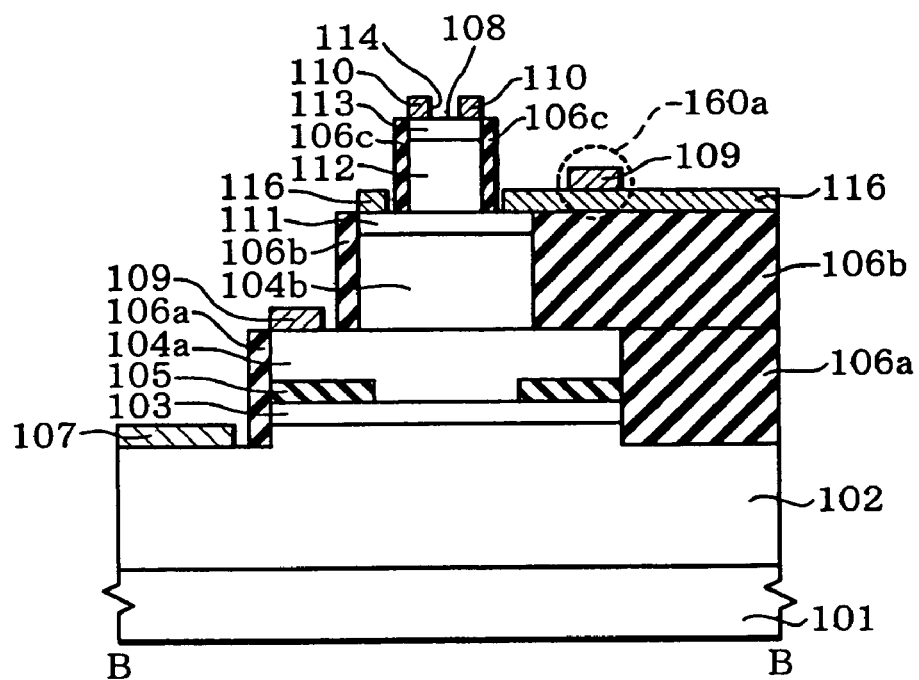
FIG. 12 is a schematic that shows a cross-sectional view taken along a line B—B of the surface-emitting type semiconductor laser shown in FIG. 10.
Figure 13:
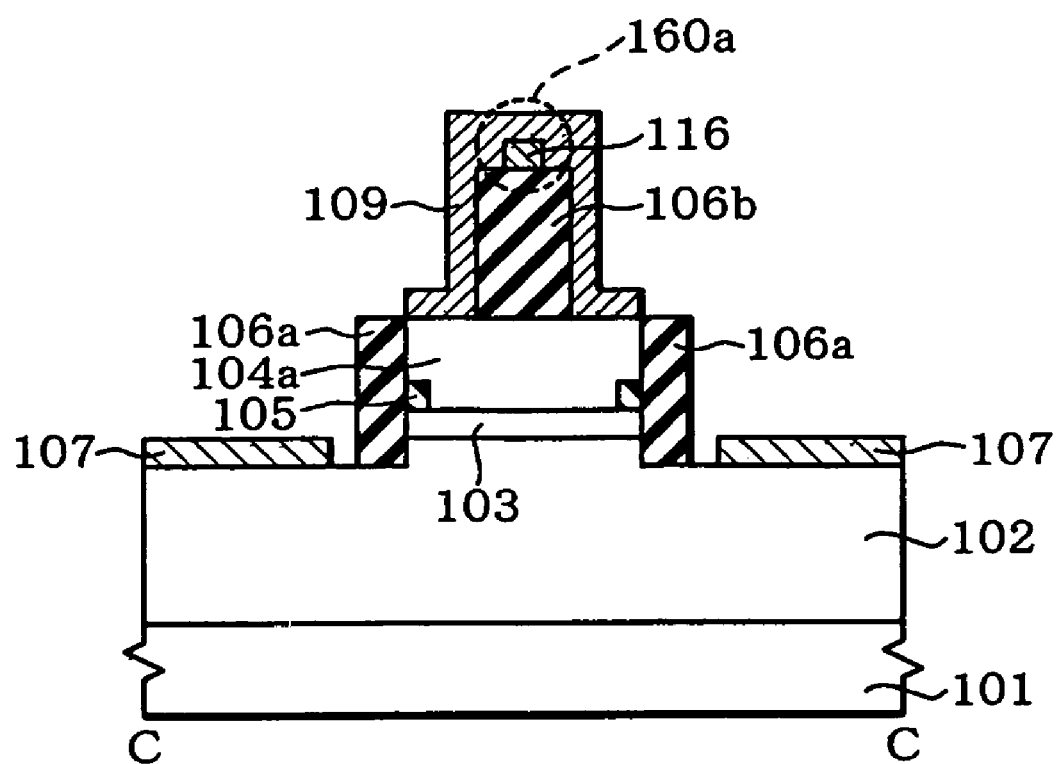
FIG. 13 is a schematic that shows a cross-sectional view taken along a line C—C of the surface-emitting type semiconductor laser shown in FIG. 10.

According to Connection Method 1, as indicated in FIG. 9A and FIG. 10 through FIG. 13, the second electrode 109 of the light emitting element section 140 and the third electrode 116 of the photodetector section 120 are electrically connected at an electrode connection section 160a. More specifically, as shown in FIG. 12 and FIG. 13, the electrode connection section 160a is provided between the surface-emitting laser 100 and an electrode pad (not shown), and the second electrode 109 and the third electrode 116 are electrically connected at this electrode connection section 160a. In other words, the second electrode 109 is provided on the third electrode 116 at the electrode connection section 160a.

The third electrode 116 is formed extending from the first contact layer 111 of the photodetector section 120 to the dielectric layer 106b. The second electrode 109 is formed extending from the first region 104a of the second mirror 104, via the dielectric layer 106b to the dielectric layer 106a and the second electrode 109. It is noted that the dielectric layers 106a, 106b and 106c can be formed together, or may be formed individually. This similarly applies to Connection Methods 2–4 to be described below. Moreover, in Connection Method 2–4, although cross-sectional views are omitted, a layer structure similar to that of the surface-emitting laser 100 shown in FIG. 10–FIG. 13 is provided except electrodes to be described below.

(B) Connection Method 2

In Connection Method 2, the second electrode 109 of the light emitting element section 140 and the fourth electrode 110 of the photodetector section 120 are electrically connected at an electrode connection section 160b, as shown in FIG. 14. This electrode connection section 160b is provided between the surface-emitting laser 100 and an electrode pad (not shown). At the electrode connection section 160b, the second electrode 109 is provided on the fourth electrode 110.

The fourth electrode 110 is formed extending from the second contact layer 113 to the dielectric layer 106c, and the second electrode 109 is formed extending from the first region 104a of the second mirror 104 via the dielectric layer 106c to the fourth electrode 110.

(C) Connection Method 3

Figure 15:
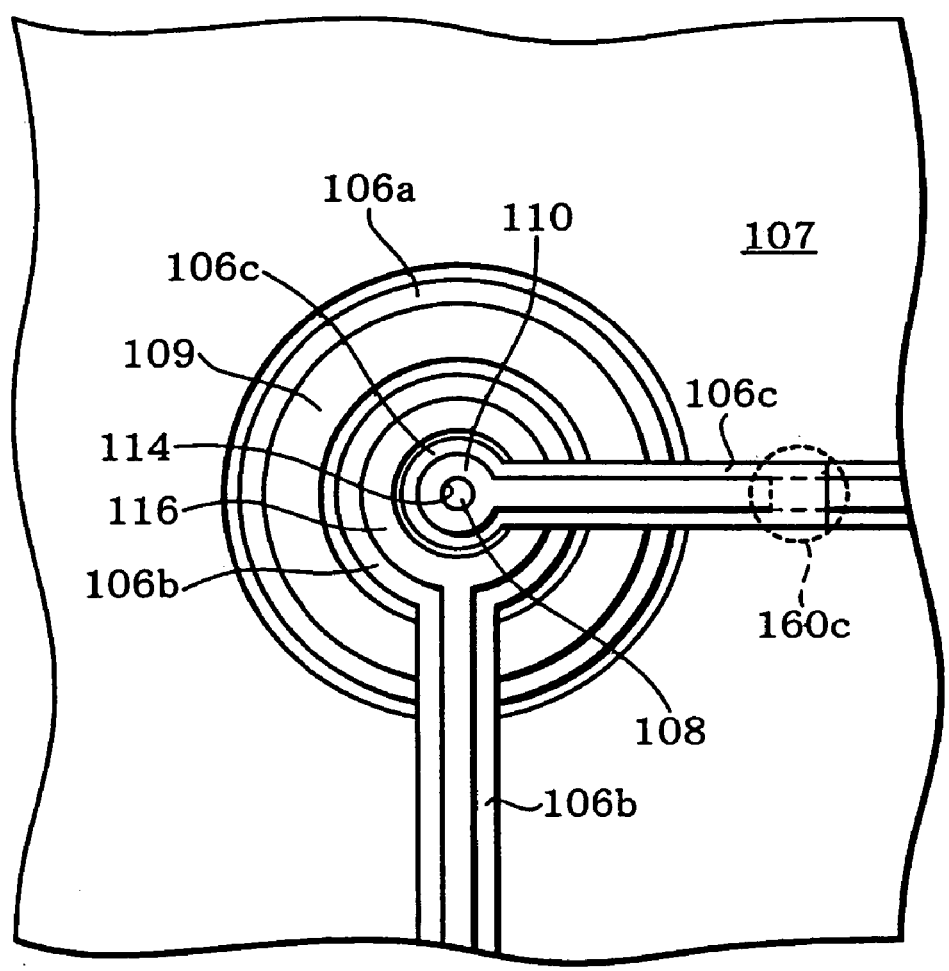
FIG. 15 is a schematic plan view showing an electrode structure of the surface-emitting type semiconductor laser shown in FIG. 1, when the connection method indicated in FIG. 9C is used.

In Connection Method 3, the first electrode 107 of the light emitting element section 140 and the fourth electrode 110 of the photodetector section 120 are electrically connected at an electrode connection section 160c, as shown in FIG. 15. This electrode connection section 160c is provided between the surface-emitting laser 100 and an electrode pad (not shown), in areas excluding the light emitting element section 140 and the photodetector section 120. At the electrode connection section 160c, the first electrode 107 is provided on the fourth electrode 110.

The fourth electrode 110 is formed extending from the second contact layer 113 to the dielectric layer 106c, and the first electrode 107 is formed extending from the first mirror 102 via the dielectric layer 106c to the fourth electrode 110.

(D) Connection Method 4

Figure 16:
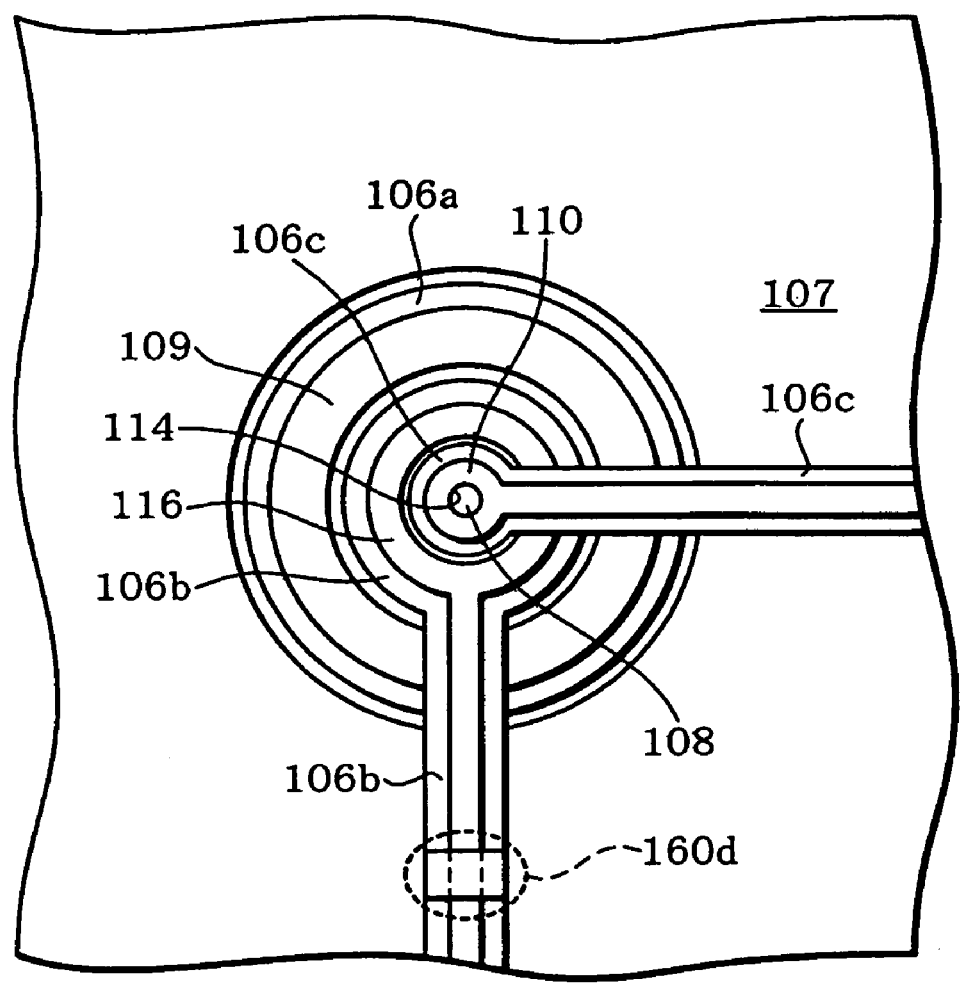
FIG. 16 is a plan view schematically showing an electrode structure of the surface-emitting type semiconductor laser shown in FIG. 1, when the connection method indicated in FIG. 9D is used.

In Connection Method 4, the first electrode 107 of the light emitting element section 140 and the third electrode 116 of the photodetector section 120 are electrically connected at an electrode connection section 160d, as shown in FIG. 16. This electrode connection section 160d is provided between the surface-emitting laser 100 and an electrode pad (not shown). At the electrode connection section 160d, the first electrode 107 is provided on the third electrode 116.

The third electrode 116 is formed extending from the first contact layer 111 to the dielectric layer 106b, and the first electrode 107 is formed extending from the first mirror 102 via the dielectric layer 106d to the third electrode 116.

(E) Actions and Effects

Figure 9A:
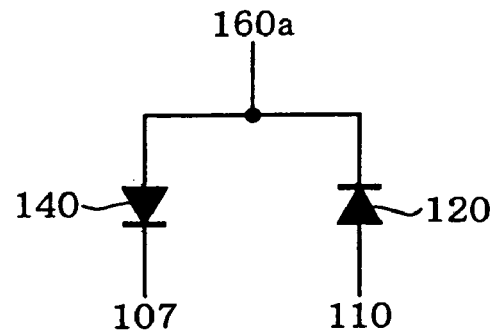
FIG. 9A–FIG. 9D are schematics that show connection methods for electrodes of the surface-emitting type semiconductor laser shown in FIG. 1.

In Connection Method 1, the second electrode 109 of the light emitting element section 140 and the third electrode 116 of the photodetector section 120 are electrically connected, as shown in FIG. 9A. In this case, a parasitic capacitance is not generated between the light emitting element section 140 and the photodetector section 120 because no potential difference is generated between the second electrode 109 and the third electrode 116.

Figure 9B:
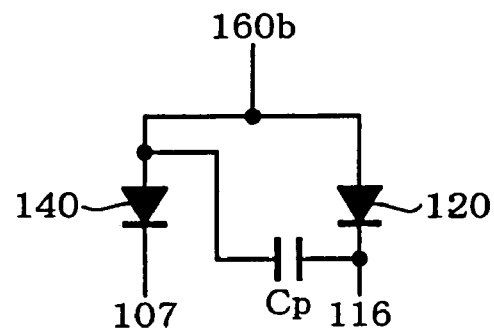
Figure 9C:
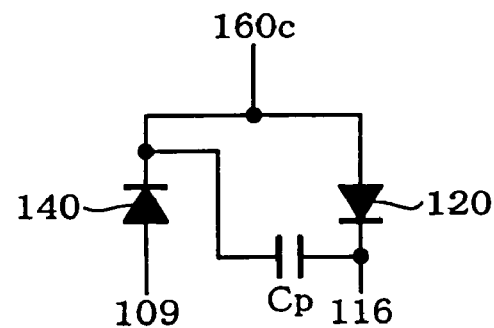
Figure 9D:
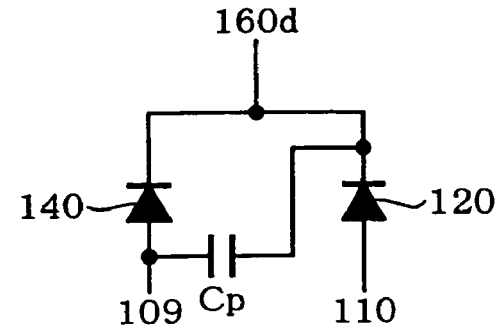

On the other hand, according to Connection Method 2, the second electrode 109 of the light emitting element section 140 and the fourth electrode 110 of the photodetector section 120 are electrically connected, as shown in FIG. 9B. In this case, a potential difference is generated between the second electrode 109 and the fourth electrode 110, and as a result, a parasitic capacitance $C_p$ is generated. Here, when a "layer of a high nonconductivity" is formed between the light emitting element section 140 and the photodetector section 120, the generated parasitic capacitance $C_p$ is large. In other words, the smaller the film thickness of the "layer of a high nonconductivity", the greater the generated parasitic capacitance $C_p$.

Also, a parasitic capacitance $C_p$ is similarly generated in Connection Method 3 and 4, when a potential difference is generated between the first electrode 107 and the fourth electrode 110 and between the first electrode 107 and the third electrode 116.

For instance, in the related art surface-emitting laser 900 shown in FIG. 23, a dielectric layer 915 is provided between the light emitting element section 940 and the photodetector section 120. As described above, the dielectric layer 915 that is formed by oxidizing a layer including Al has a small mechanical strength. In particular, the mechanical strength of the surface-emitting laser 100 decreases when the film thickness of the dielectric layer 915 is thickly formed. Therefore, the dielectric layer 915 needs to be formed thinly to some degree. However, when the film thickness of the dielectric layer 915 is small, the parasitic capacitance $C_p$ that is generated between the light emitting element 940 and the photodetector section 120 becomes larger.

In contrast, according to the surface-emitting laser 100 of the present exemplary embodiment, the second region 104b in the second mirror 104 of the light emitting element 140 has a higher resistance than that of the first region 104a, and the second region 104b contacts the photodetector section 120. Therefore, this second region 104b corresponds to a "layer having a high nonconductivity" provided between the light emitting element section 140 and the photodetector section 120 in the above-described Connection Method 2–4.

However, because the second region 104b is a part of the second mirror 104, the second region 104b can be formed by an ordinary epitaxial growth method. Therefore, the second region 104b can be formed with a great film thickness. In other words, the second region 104b that is a "layer having a high nonconductivity" provided between the light emitting element section 140 and the photodetector section 120 can be formed with a great film thickness. As a result, because the parasitic capacitance $C_p$ to be generated can be controlled in the above described Connection Method 2–4, the surface-emitting laser 100 can be driven at a high-speed.

Also, as described above, any of Connection Methods 1–4 can be applied to the surface-emitting laser 100 according to the present exemplary embodiment. As a result, because the connection method of each electrode can be changed without changing the layered structure of the surface-emitting laser 100, the surface-emitting laser 100 with a three terminal structure, that has a degree of freedom in choosing structures and can be driven at high-speed can be obtained. Also, the surface-emitting laser 100 with a three terminal structure in different inter-electrode connection methods can be obtained without changing the manufacturing processes other than the electrode forming process.

(3) Actions and Effects 3

In addition, according to the surface-emitting laser 100 of the present exemplary embodiment, the second mirror 104 is provided on the active layer 103, and the second region 104b is provided on the first region 104a in the second mirror 104. Moreover, the first electrode 107 and the second electrode 109 to drive the light emitting element 140 are included, and the second electrode 109 contacts the first region 104a of the second mirror 104. In other words, because the second electrode 109 is provided in a much closer proximity to the active layer 103, the voltage can be efficiently applied to the active layer 103.

In addition, the second region 104b is provided on the first region 104a, and the second electrode 109 is provided on the first region 104a, such that an electric current does not flow to the second region 104b. In other words, carriers do not move in the second region 104b, and carriers move only in the first region 104a. Therefore, because carriers can move in the surface-emitting laser 100 via a hetero junction with fewer carriers, the surface-emitting laser 100 with a lower resistance can be obtained.

Moreover, in an ordinary surface-emitting laser, impurities are added in a mirror to lower the resistance of the mirror. Because of the addition of these impurities, absorptive scattering of light might occur and luminous efficiency may decrease. In contrast, according to the surface-emitting laser 100 of the present exemplary embodiment, the second region 104b of the second mirror 104, compared to the first region 104a, has a concentration of impurities of the same conductivity type as that of the first region 104a which is lower than that of the first region 104a, or impurities of the same conductivity type are not added. Consequently, the second region 104b has a higher resistance than that of the first region 104a. As a result, the problem caused by the addition of impurities described above can be solved.

[Second Exemplary Embodiment]

1. Structure of Optical Device

Figure 18:
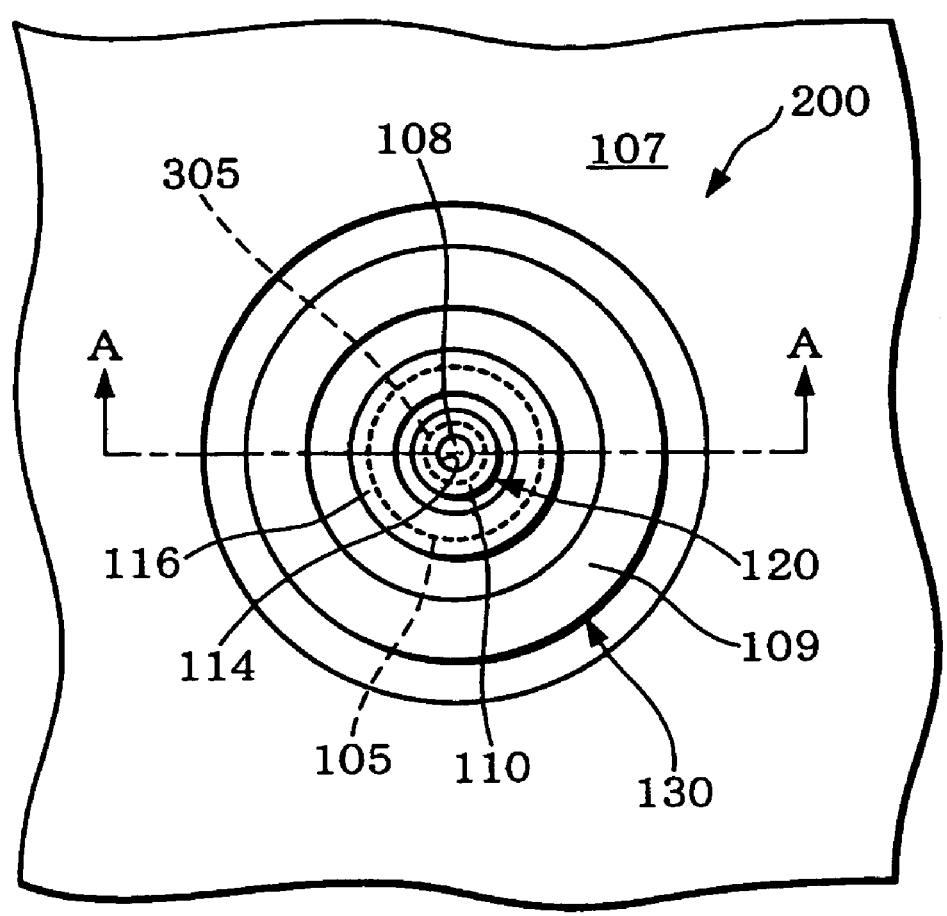
FIG. 18 is a schematic shows a plan view of the surface-emitting type semiconductor laser shown in FIG. 17.

FIG. 17 is a schematic that shows a view of a surface-emitting laser 200 in accordance with a second exemplary embodiment of the present invention. FIG. 18 is a schematic that shows a view of the surface-emitting laser 200 shown in FIG. 17.

The surface-emitting laser 200 of the present exemplary embodiment has a structure different from the surface-emitting laser 100 of the first exemplary embodiment in point that a reflection layer 305 is provided in the second region 104b of the second mirror 104. The surface-emitting laser 200 is similar in its structure to the surface-emitting laser 100 of the first exemplary embodiment except for the above-mentioned point. Accordingly, the same codes are assigned to components similar to those of the surface-emitting laser 100 of the first exemplary embodiment and their detailed description is omitted.

The reflection layer 305 has the function to reflect spontaneous emission light. The reflection layer 305 can be formed by using the same material (a layer including aluminum oxide) as that of the current constricting layer 105 for instance. In this case, the reflection layer 305 can be formed by a process similar to that used for the current constricting layer 105. More specifically, a layer (not shown) having a high Al composition is formed in the second region 104b of the second mirror 104 in advance, and the reflection layer 305 can be formed by oxidizing this layer from its side.

An aluminum oxide (AlOx) layer is usually a dielectric layer whose refractive index is lower than that of a surrounding semiconductor layer. Refractive index of an aluminum oxide layer is about 1.6, and refractive index of a semiconductor layer is usually 2.9–3.5.

Also, the film thickness of the reflection layer 305 can be set to n/4 (n is a natural number) of the wavelength of the laser light generated at the light emitting element 140. As a result, the reflection of modes of the above-described laser light can be increased.

2. Operations of Optical Device

Principle operations of the surface-emitting laser 200 of the present exemplary embodiment are similar to those of the surface-emitting laser 100 of the first exemplary embodiment, and therefore their detailed description is omitted.

3. Actions and Effects

The surface-emitting laser 200 in accordance with the present exemplary embodiment substantially has the same actions and effects with the surface-emitting laser 100 in accordance with the first exemplary embodiment.

In addition, according to the surface-emitting laser 200 of the present exemplary embodiment, the photodetector section 120 has a function to detect the light output of the light emitting element section 140. Therefore, the output of light generated at the light emitting element section 140 might not be detected correctly, if light other than the laser light generated at the light emitting element 140 enters the photodetector section 120. However, according to the surface-emitting laser 200 of the present exemplary embodiment, the reflection layer 305 is provided in the second region 104b of the second mirror 104, such that spontaneous emission light is prevented from entering the photodetector section 120. As a result, only the laser light generated in the light emitting element section 140 can be injected in the photodetector section 120, such that the output of light generated in the light emitting element section 140 can be detected more accurately by the photodetector section 120.

Also, for instance, when a reflection layer is provided in a photodetector section, the efficiency of the photodetector section might decrease by this reflection layer. In contrast, in the surface-emitting laser 200 in accordance with the present exemplary embodiment, the reflection layer 305 is provided in the second region 104b of the second mirror 104 but not in the photodetector section 120, such that the efficiency of the photodetector section 120 is not lowered by the existence of the reflection layer 305.

In addition, no electric current flows to this second region 104b. Therefore, the reflection layer 305 can be set up regardless of the current path because the reflection layer 305 is provided in the second region 104b of the second mirror 104. In other words, the current path is not affected by setting up the reflection layer 305. Therefore, the characteristics of the light emitting element section 140 are not changed as a result of the provision of the reflection layer 305.

In addition, the reflection layer 305 does not need a new manufacturing process because it can be formed by applying the design of mirrors ordinarily used.

[Third Exemplary Embodiment]

1. Structure of Optical Device

Figure 19:
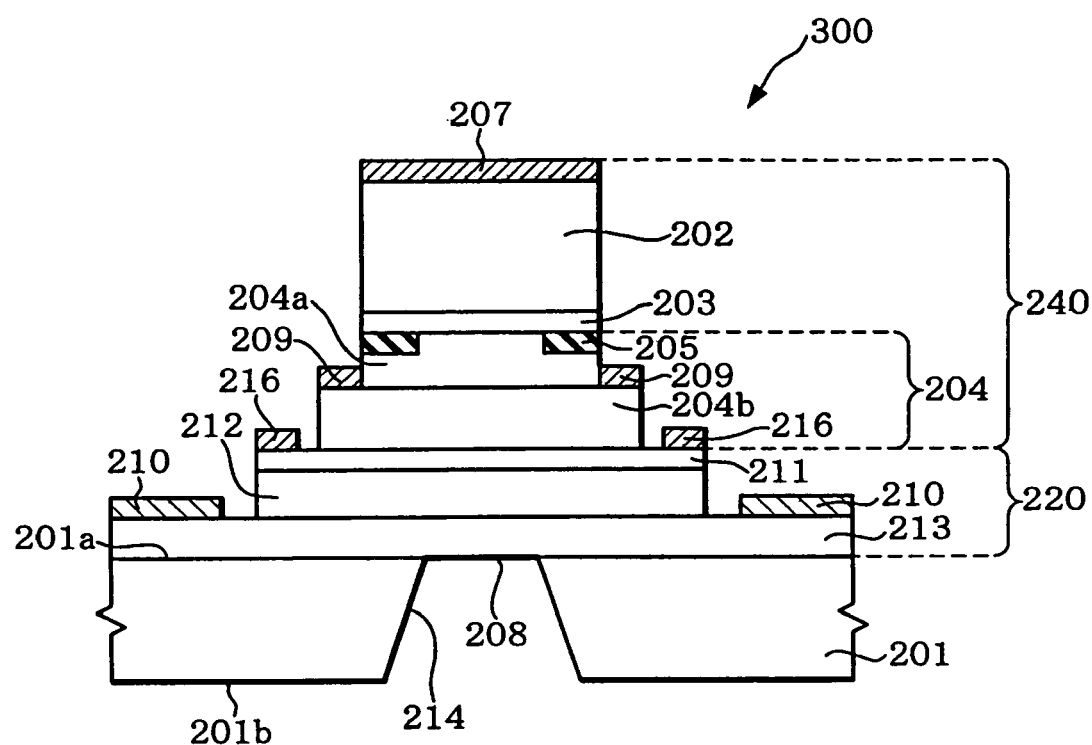
FIG. 19 is a schematic that shows a cross-sectional view of a surface-emitting type semiconductor laser in accordance with a third exemplary embodiment of the present invention.

FIG. 19 is a schematic that shows a view of a surface-emitting laser 300 in accordance with a third exemplary embodiment of the present invention.

The surface-emitting laser 300 of the present exemplary embodiment has a structure different from the surface-emitting laser 100 of the first exemplary embodiment in point that a photodetector section 220 and a light emitting element section 240 are stacked in layers in this order on a semiconductor substrate 201.

It is noted that, components of the surface-emitting laser 300, which are similar to those components "1xx" of the surface-emitting laser 100 of the first exemplary embodiment, are indicated as "2xx". In other words, since codes "2xx" represent components similar to the components "1xx" of the surface-emitting laser 100 of the first exemplary embodiment, and are principally composed of similar materials, their detailed description is omitted.

The surface-emitting laser 300 of the present exemplary embodiment includes a photodetector section 220 provided on a semiconductor substrate 201, and a light emitting element section 240 provided on the photodetector section 220. The surface-emitting laser 300 emits light generated in the light emitting element section 240 from its emission surface 208.

The photodetector section 220 includes a second contact layer 213, a photoabsorption layer 212, and a first contact layer 211. The second contact layer 213 of p-type, the photoabsorption layer 212, and the first contact layer 211 of n-type are stacked in layers in this order on the semiconductor substrate 201 of p-type GaAs. The second contact layer 213, the photoabsorption layer 212, and the first contact layer 211 can be formed with the same material as those of the second contact layer 113, the photoabsorption layer 112 and the first contact layer 111 of the first exemplary embodiment, respectively.

The light emitting element section 240 includes a second mirror 204, an active layer 203, and a first mirror 202. The second mirror 204 consists of a first region 204a and a second region 204b. The second region 204b contacts the photodetector section 220, and has a higher resistance that that of the first region 204a. The first region 204a and second region 204b of p-type of the second mirror 204, the active layer 203, and the first mirror 202 of n-type are stacked in layers in this order on the photodetector section 220. The first region 204a and second region 204b of the second mirror 204, the active layer 203, and the first mirror 202 can be formed with the same material as those of the first region 104a and second region 104b of the second mirror 104, the active layer 103, and the first mirror 102 of the first exemplary embodiment. Further, a current constricting layer 205 is provided in the second mirror 204, like the second mirror 104 in the first exemplary embodiment.

The surface-emitting laser 300 of the present exemplary embodiment also includes a first electrode 207, a second electrode 209, a third electrode 216 and a fourth electrode 210. The first electrode 207 and the second electrode 209 are used to drive the light emitting element section 240. Also, the third electrode 216 and the fourth electrode 210 are used to drive the photodetector section 220.

The first electrode 207 is provided on the first mirror 202. The second electrode 209 contacts the first region 204a of the second mirror 204. The third electrode 216 is provided on the first contact layer 211. The fourth electrode 210 is provided on the second contact layer 213. The second electrode 209, the third electrode 216 and the fourth electrode 210 can have a planar configuration in a ring shape. In this case, the second electrode 209 is provided to surround the light emitting element section 240, the third electrode 216 is provided to surround the light emitting element section 240 and the first region 204a of the second mirror 204, and the fourth electrode 210 is provided to surround the first contact layer 211 and the photoabsorption layer 212.

Moreover, in the surface-emitting laser 300 of the present exemplary embodiment, when a surface of the photodetector section 220 whose portion contacts the semiconductor substrate 201 is assume to be an upper surface (surface 210a), an a surface thereof which contacts the light emitting element 240 is assumed to be a lower surface (surface 210b), the emission surface 208 is provided on the upper surface (surface 201a) of the surface-emitting laser 300. More specifically, in the surface-emitting laser 300, an opening 214, that penetrates the semiconductor substrate 201, is provided in the semiconductor substrate 201, and the bottom of this opening 214 defines the emission surface 208.

2. Operations of Optical Device

In the surface-emitting laser 300 of the present exemplary embodiment, the order of stacked layers of the light emitting element section 240 and the photodetector section 220 on the semiconductor substrate 201 is reverse with respect to the surface-emitting laser 100 of the first exemplary embodiment. However, because basic operations of the surface-emitting laser 300 of the present exemplary embodiment are similar to those of the surface-emitting laser 100 of the first exemplary embodiment, a detailed description thereof is omitted.

In other words, in the surface-emitting laser 300 of the present exemplary embodiment, after laser light is generated in the light emitting element 240, the laser light passes the photodetector section 220 and goes out from the emission surface 208. It is noted here that a part of the laser light generated in the light emitting element 240 is absorbed by the photoabsorption layer 212 of the photodetector section 220, and converted into an electric current, thereby detecting an output of the light generated by the light emitting element section 240.

3. Actions and Effects

The surface-emitting laser 300 in accordance with the present exemplary embodiment substantially has the same actions and effects as those of the surface-emitting laser 100 in accordance with the first exemplary embodiment.

[Fourth Exemplary Embodiment]

Figure 20:
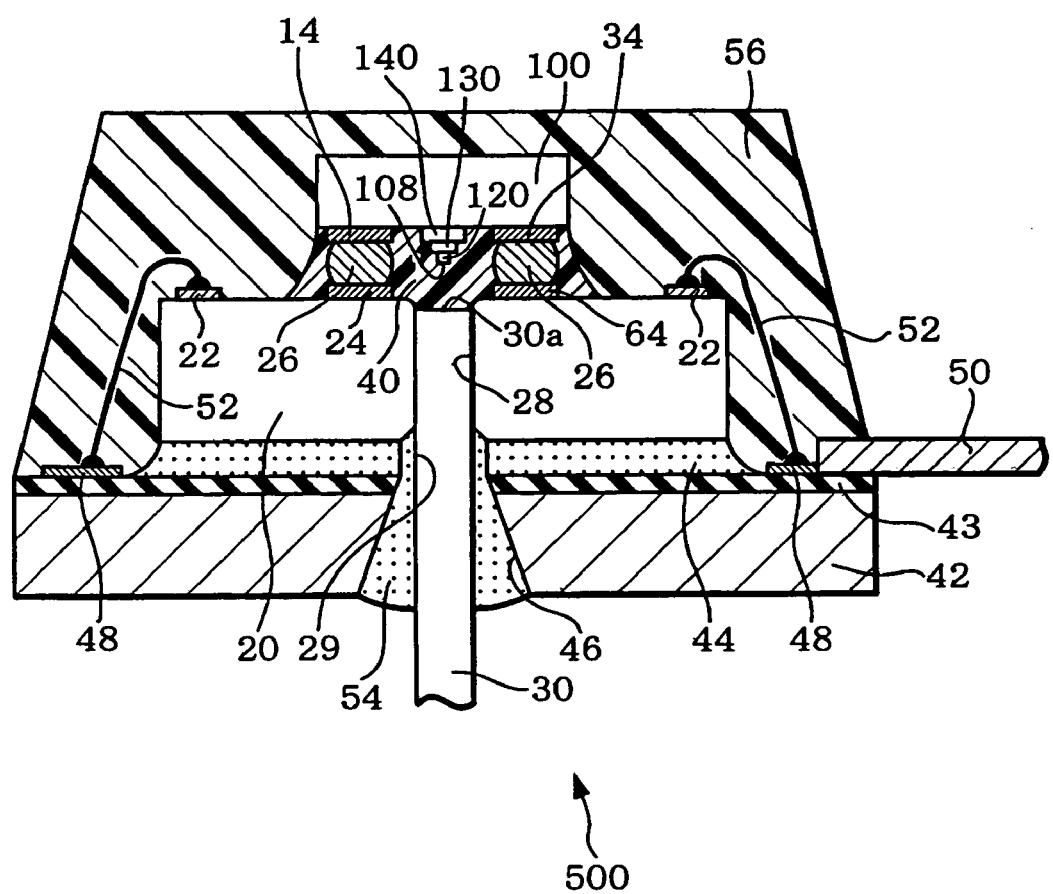
FIG. 20 is a schematic that shows an optical module in accordance with a fourth exemplary embodiment of the present invention.

FIG. 20 is a schematic that shows an optical module 500 in accordance with a fourth exemplary embodiment of the present invention. The optical module 500 includes a surface-emitting type semiconductor laser 100 of the first exemplary embodiment (see FIG. 1), a semiconductor chip 20 and an optical fiber 30. It is noted that, in the optical module 500 of the present exemplary embodiment, the same actions and effects can be obtained even when a surface-emitting type semiconductor laser of any one of the other above-described exemplary embodiments is used instead of the surface-emitting type semiconductor laser 100 of the first exemplary embodiment. The same applies to fifth and sixth exemplary embodiments to be described below.

1. Structure of Optical Module

The surface-emitting type semiconductor laser 100 absorbs light that is emitted from an end face 30a of the optical fiber 30. The surface-emitting type semiconductor laser 100 is in a state in which its position relative to the end face 30a of the optical fiber 30 is fixed. More specifically, the emission surface 108 of the surface-emitting type semiconductor laser 100 opposes to the end face 30a of the optical fiber 30.

The semiconductor chip 20 is provided for driving the surface-emitting type semiconductor laser 100. In other words, the semiconductor chip 20 is provided with a built-in circuit for driving the surface-emitting type semiconductor laser 1 00. The semiconductor chip 20 includes a plurality of electrodes (or pads) 22 formed therein that are electrically connected to the internal circuit. Wiring patterns 24 and 64, which are electrically connected to at least one of the electrodes 22, may preferably be formed on a surface where the electrodes 22 are formed.

The semiconductor chip 20 and the surface-emitting type semiconductor laser 100 are electrically connected with each other. For example, a wiring pattern 14 and the wiring pattern 24 formed on the semiconductor chip 20 are electrically connected with one another through solder 26. The wiring pattern 14 is electrically connected to the first electrode 107 of the surface-emitting type semiconductor laser 100 (not shown in FIG. 20). Also, the wiring pattern 34 is electrically connected to the wiring pattern 64 formed on the semiconductor chip 20 through solder 26. The wiring pattern 34 is electrically connected to the first electrode 107 of the surface-emitting type semiconductor laser 100 (not shown in FIG. 20). Also, the third electrode 116 and the fourth electrode 110 of the surface-emitting type semiconductor laser 100 (not shown in FIG. 20) are electrically connected to wiring patterns (not shown).

The surface-emitting type semiconductor laser 100 can be face-down mounted on the semiconductor chip 20. By so doing, the solder 26 not only provides electrical connection, but also fixes the surface-emitting type semiconductor laser 100 and the semiconductor chip 20. It is noted that, for connection between the wiring patterns 14 and the wiring patterns 24, and between the wiring patterns 34 and the wiring patterns 64, wires or conductive paste may be used.

An underfill material 40 may be provided between the surface-emitting type semiconductor laser 100 and the semiconductor chip 20. When the underfill material 40 covers the emission surface 108 of the surface-emitting type semiconductor laser 100, the underfill material 40 may preferably be transparent. The underfill material 40 covers and protects electrical connection sections between the surface-emitting type semiconductor laser 100 and the semiconductor chip 20, and also protects the surfaces of the surface-emitting type semiconductor laser 100 and the semiconductor chip 20. Furthermore, the underfill material 40 maintains the connected state between the surface-emitting type semiconductor laser 100 and the semiconductor chip 20.

An aperture (for example, a through hole) 28 may be formed in the semiconductor chip 20. The optical fiber 30 is inserted in the aperture 28. The aperture 28 is formed extending from the surface where the electrodes 22 are formed to the opposite surface, while avoiding the internal circuit. A taper 29 may preferably be formed at an edge section of at least one of openings of the aperture 28. By forming the taper 29, the optical fiber 30 can be readily inserted in the aperture 28.

The semiconductor chip 20 may be attached to a substrate 42. More specifically, the semiconductor chip 20 may be attached to the substrate 42 through adhesive 44. An aperture 46 is formed in the substrate 42. The aperture 46 is formed at a position that connects to the aperture 28 of the semiconductor chip 20. The adhesive 44 that adheres the semiconductor chip 20 and the substrate 42 is provided in a manner not to disturb the continuation of the two apertures 28 and 46 and not to block them. The aperture 46 in the substrate 42 has a tapered configuration such that its inner diameter becomes greater in an opposite direction to the semiconductor chip 20. By this, the optical fiber 30 can be readily inserted.

The substrate 42 may be formed from a material that is nonconductive, such as, resin, glass, ceramics or the like, but may be formed from a material that is conductive, such as, metal or the like. When the substrate 42 is formed from a conductive material, a dielectric film 43 may preferably be formed at least on the surface on which the semiconductor chip 20 is mounted. It is noted that a material similar to that of the substrate 42 can also be used in exemplary embodiments to be described below.

Also, the substrate 42 may preferably have a high thermal conductivity. By this, the substrate 42 promotes emanation of heat of at least one of the semiconductor device 100 and the semiconductor chip 20. In this case, the substrate 42 functions as a heat sink or a heat spreader. In the present exemplary embodiment, the substrate 42 is adhered to the semiconductor chip 20, and therefore can directly cool the semiconductor chip 20. It is noted that the adhesive 44 that adheres the semiconductor chip 20 and the substrate 42 may preferably have a thermal conductivity. Furthermore, as the semiconductor chip 20 is cooled, the surface-emitting type semiconductor laser 100 connected to the semiconductor chip 20 is also cooled.

The substrate 42 is provided with wiring patterns 48. Also, the substrate 42 is provided with external terminals 50. In the present exemplary embodiment, the external terminals 50 are leads. The wiring patterns 48 that are formed on the substrate 42 are electrically connected, for example, through wires 52, to the electrodes 22 of the semiconductor chip 20 and at least one of the wiring patterns 24 and 64 formed on the semiconductor chip 20. Also, the wiring patterns 48 may be electrically connected to the external terminals 50.

The optical fiber 30 is inserted in the aperture 28 of the semiconductor chip 20. Also, the optical fiber 30 is passed through the aperture 46 of the substrate 42. The inner diameter of the aperture 46 gradually reduces toward the aperture 28 of the semiconductor chip 20, and the inner diameter of the aperture 46 is greater than that of the optical fiber 30 on the surface opposite to the semiconductor chip 20. A gap between the optical fiber 30 and the inner surface of the aperture 46 may preferably be filled with a filler material 54 such as resin. The filler material 54 also has a function to fix and prevent the optical fiber 30 from slipping out.

The optical fiber 30 may be a single mode fiber, or a multiple mode fiber. When the surface-emitting type semiconductor laser 100 emits light of a multiple mode, a multiple mode fiber may be used as the optical fiber 30, such that light emitted from the surface-emitting type semiconductor laser 100 can be securely introduced into the optical fiber 30.

Also, in the optical module 500 of the present exemplary embodiment, the surface-emitting type semiconductor laser 100 and the semiconductor chip 20 are sealed with resin 56. The resin 56 also seals electrically connected sections between the surface-emitting type semiconductor laser 100 and the semiconductor chip 20 and electrically connected sections between the semiconductor chip 20 and the wiring patterns 48 formed on the substrate 42.

[Fifth Exemplary Embodiment]

Figure 21:
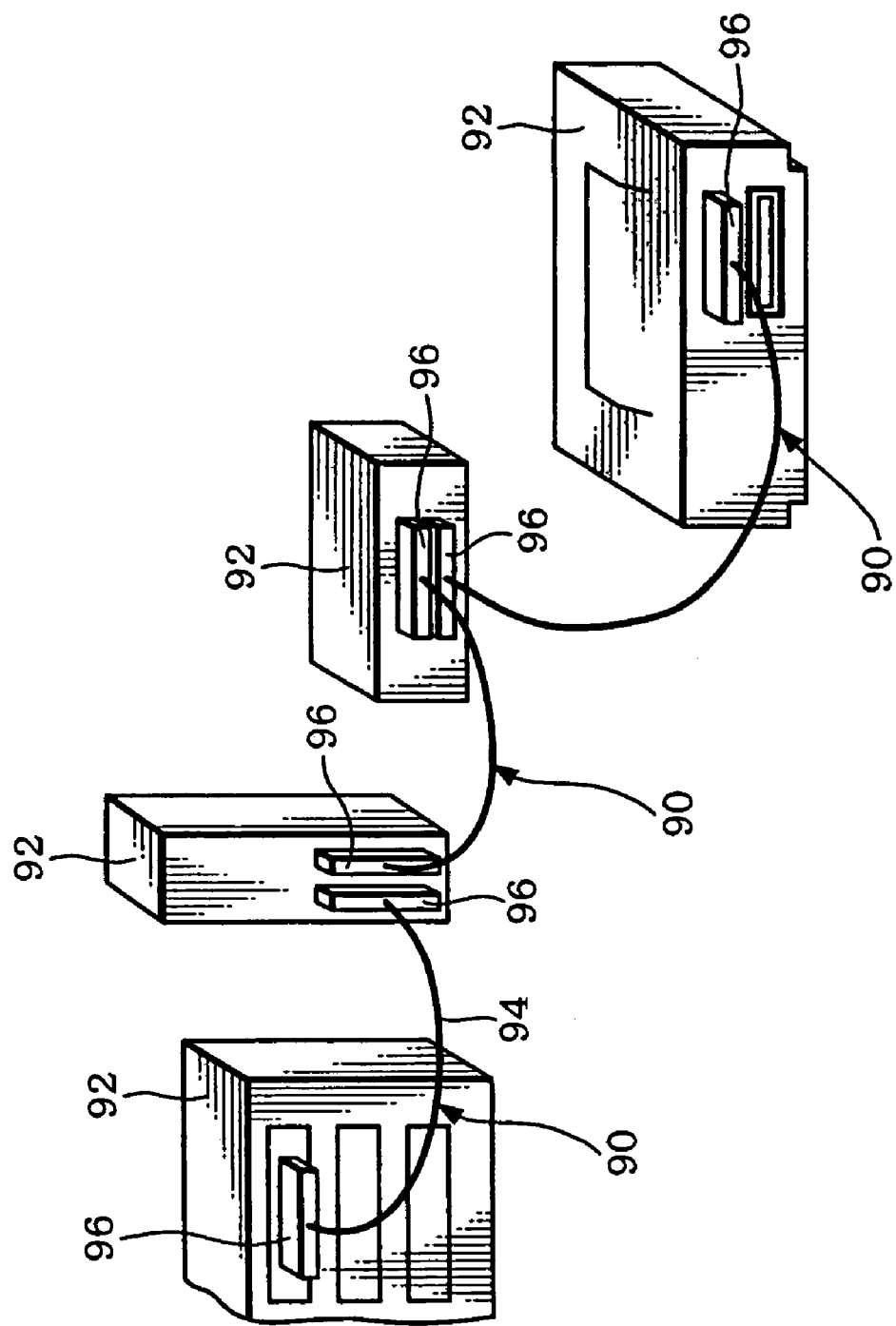
FIG. 21 is a schematic that shows optical transmission devices in accordance with a fifth exemplary embodiment of the present invention.

FIG. 21 is a schematic that shows optical transmission devices in accordance with a fifth exemplary embodiment of the present invention. The optical transmission devices 90 mutually connect electronic devices 92 such as a computer, display device, storage device, printer and the like. The electronic devices 92 may be information communication devices. The optical transmission device 90 may include a cable 94 and plugs 96 provided on both sides of the cable 94. The cable 94 includes an optical fiber 30 (see FIG. 20). The plug 96 includes on its inside a surface-emitting type semiconductor laser 100 and a semiconductor chip 20. It is noted that the optical fiber 30 is provided inside the cable 94, and the surface-emitting type semiconductor laser 100 and the semiconductor chip 20 are provided inside the plug 96, and therefore they are not shown in FIG. 21. The optical fiber 30 and the surface-emitting type semiconductor laser 100 are attached in a manner described in the fourth exemplary embodiment.

The surface-emitting type semiconductor laser 100 of the first exemplary embodiment is provided at one end of the optical fiber 30, and a photodetector (not shown) is provided at the other end of the optical fiber 30. The photodetector converts inputted optical signals into electrical signals, and then provides the electrical signals to an electronic device 92 on one side. On the other hand, electrical signals outputted from the electronic device 92 are converted by the surface-emitting type semiconductor laser 100 into optical signals. The optical signals are transmitted through the optical fiber 30 and inputted in the photodetector.

As described above, with the optical transmission device 90 of the present exemplary embodiment, information can be transmitted among the electronic devices 92 by optical signals.

[Sixth Exemplary Embodiment]

Figure 22:
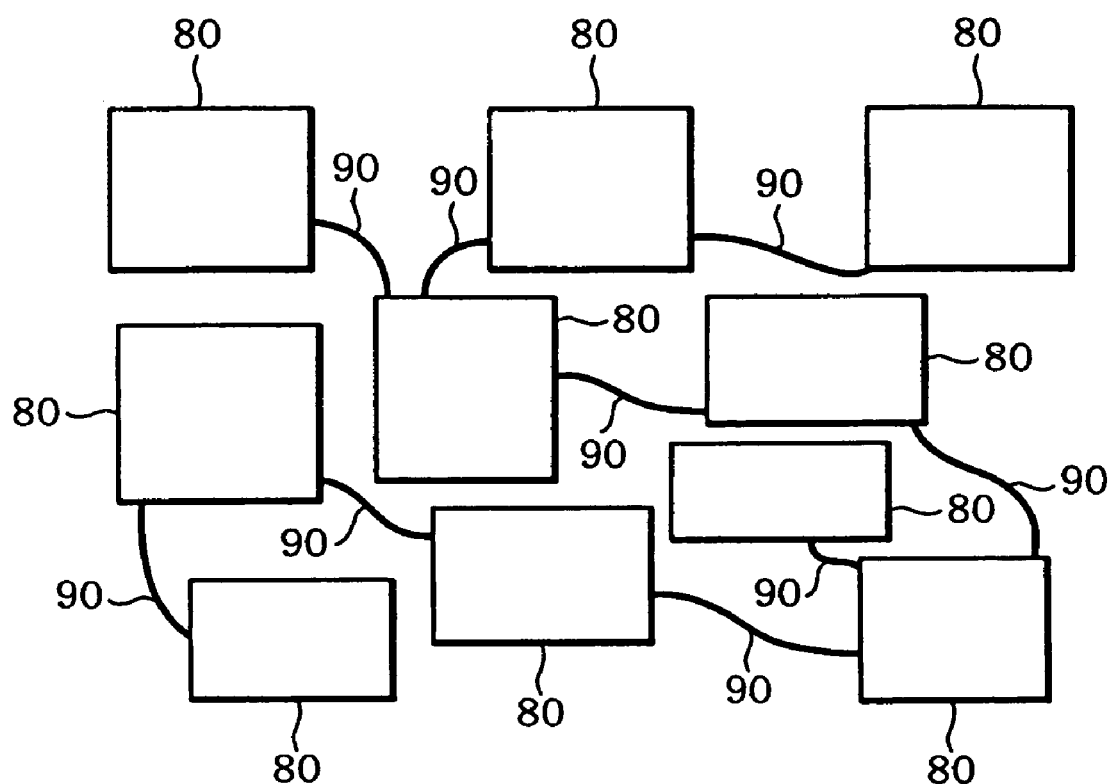
FIG. 22 is a schematic that shows a usage configuration of optical transmission devices in accordance with a sixth exemplary embodiment of the present invention.

FIG. 22 is a schematic that shows a usage configuration of optical transmission devices in accordance with a sixth exemplary embodiment of the present invention. Optical transmission devices 90 connect electronic devices 80. The electronic devices 80 include liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale) scanning), videos, tuners, gaming devices, printers and the like.

The present invention is not limited to the exemplary embodiments described above, and many modifications can be made. For example, the present invention may include compositions that are substantially the same as the compositions described in the exemplary embodiments (for example, a composition with the same function, method and result, or a composition with the same objects and result). Also, the present invention includes compositions in which portions not essential in the compositions described in the exemplary embodiments are replaced with others. Also, the present invention includes compositions that can achieve the same functions and effects or achieve the same objects of those of the compositions described in the exemplary embodiments. Furthermore, the present invention includes compositions that include publicly known technology added to the compositions described in the exemplary embodiments.

For example, in the surface-emitting type semiconductor lasers of the exemplary embodiments described above, a light emitting element section having one columnar portion is described. However, the exemplary embodiments of the present invention would not be harmed if a plurality of columnar portions are provided in a light emitting element section. Also, similar functions and effects are obtained even when a plurality of surface-emitting type semiconductor lasers are provided in an array.

Also, it should be noted that, for example, interchanging the p-type and n-type characteristics of each of the semiconductor layers in the above described exemplary embodiments does not deviate from the subject matter of the present invention. In the above described exemplary embodiments, the description is made as to an AlGaAs type, but depending on the oscillation wavelength to be generated, other materials, such as, for example, GaInP type, ZnSSe type, InGaN type, AlGaN type, InGaAs type, GaInNAs type, GaAsSb type, and like semiconductor materials can be used. When a surface-emitting type semiconductor laser of the present invention is formed by using a semiconductor material such as GaAsSb type, InGaAs type, and GaInN As type, and when laser light of a long wavelength is generated in the active layer, the Auger non-radiative recombination in the second region of the second mirror can be decreased by reducing the concentration of impurities included in the second region of the second mirror lower than the first region. As a result, the luminous efficiency of the surface-emitting type semiconductor laser can be greatly enhanced or improved.

What is claimed is:

1. A surface-emitting type semiconductor laser, comprising:
   a light emitting element section; and
   a photodetector section that is provided above the light emitting element section and includes an emission surface, the light emitting element section including a first mirror, an active layer provided above the first mirror, and a second mirror provided above the active layer, the second mirror being formed from a first region and a second region, the second region contacting the photodetector section, and a resistance of the second region being greater than a resistance of the first region,
   the first region and the second region including an impurity of a first conductivity type, and a concentration of the impurity of the first conductivity type in the second region being lower than a concentration of the impurity of the first conductivity type in the first region.

2. The surface-emitting type semiconductor laser defined in claim 1, further comprising:
   a first electrode; and
   a second electrode to drive the light emitting element section, the second electrode being in contact with the first region.

3. The surface-emitting type semiconductor laser defined in claim 2, further comprising:
- a third electrode; and
- a fourth electrode to drive the photodetector section, one of the first electrode and the second electrode and one of the third electrode and the fourth electrode being electrically connected at an electrode connection section.

4. The surface-emitting type semiconductor laser defined in claim 3, the electrode connection section being provided in a region extending to an electrode pad except the light emitting element section and the photodetector section.

5. The surface-emitting type semiconductor laser defined in claim 1, the second region having a film thickness of 1 μm or greater.

6. The surface-emitting type semiconductor laser defined in claim 1, a concentration of an impurity of a first conductivity type in the second region being less than $1 \times 10^{16}$.

7. The surface-emitting type semiconductor laser defined in claim 1, the second region further including an impurity of a second conductivity type and being semi-dielectric.

8. The surface-emitting type semiconductor laser defined in claim 1, the second region including an intrinsic semiconductor.

9. The surface-emitting type semiconductor laser defined in claim 1, the first region including a current constriction layer.

10. The surface-emitting type semiconductor laser defined in claim 1, the second region including a layer to reflect spontaneous emission light.

11. The surface-emitting type semiconductor laser defined in claim 1, the photodetector section having a function to convert a part of light generated by the light emitting element section to a current.

12. The surface-emitting type semiconductor laser defined in claim 1, the photodetector section further including:
- a first contact layer;
- a light absorbing layer provided above the first contact layer; and
- a second contact layer provided above the light absorbing layer.

13. The surface-emitting type semiconductor laser defined in claim 1, the light emitting element section and the photodetector section having a whole one of a pnpn structure and a npnp structure.

* * * * *